(12) United States Patent
Heinrich

(10) Patent No.: US 10,636,766 B2
(45) Date of Patent: Apr. 28, 2020

(54) CHIP ASSEMBLY

(71) Applicant: Infineon Technologies AG, Neubiberg (DE)

(72) Inventor: Alexander Heinrich, Bad Abbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/800,127

(22) Filed: Nov. 1, 2017

(65) Prior Publication Data

US 2018/0068982 A1 Mar. 8, 2018

Related U.S. Application Data

(62) Division of application No. 14/870,064, filed on Sep. 30, 2015, now Pat. No. 9,837,381.

(30) Foreign Application Priority Data

Oct. 15, 2014 (DE) .................. 10 2014 114 982

(51) Int. Cl.
  *H01L 25/065* (2006.01)
  *H01L 23/482* (2006.01)
  (Continued)

(52) U.S. Cl.
  CPC ...... *H01L 25/0655* (2013.01); *H01L 21/6835* (2013.01); *H01L 23/13* (2013.01); *H01L 23/4827* (2013.01); *H01L 23/49503* (2013.01); *H01L 23/49513* (2013.01); *H01L 24/05* (2013.01); *H01L 24/29* (2013.01); *H01L 24/83* (2013.01); *H01L 24/97* (2013.01); *H01L 25/50* (2013.01); *H01L 23/544* (2013.01); *H01L 24/27* (2013.01); *H01L 24/32* (2013.01); *H01L 24/75* (2013.01); *H01L 2221/68354* (2013.01); *H01L 2223/54426* (2013.01); *H01L 2223/54486* (2013.01); *H01L 2224/04026* (2013.01); *H01L 2224/05073* (2013.01); *H01L 2224/05082* (2013.01); *H01L 2224/05124* (2013.01);

(Continued)

(58) Field of Classification Search
  None
  See application file for complete search history.

(56) References Cited

U.S. PATENT DOCUMENTS 6,238,996 B1 * 5/2001 Liu ................... H01L 21/76232
  257/E21.549
6,239,484 B1 * 5/2001 Dore ..................... H01L 21/563
  257/687

(Continued)

FOREIGN PATENT DOCUMENTS

JP 2012222284 A * 11/2012

*Primary Examiner* — Telly D Green
(74) *Attorney, Agent, or Firm* — Viering, Jentschura & Partner MBB

(57) ABSTRACT

A method of forming a chip assembly may include forming a plurality of cavities in a carrier; The method may further include arranging a die attach liquid in each of the cavities; arranging a plurality of chips on the die attach liquid, each chip comprising a rear side metallization and a rear side interconnect material disposed over the rear side metallization, wherein the rear side interconnect material faces the carrier; evaporating the die attach liquid; and after the evaporating the die attach liquid, fixing the plurality of chips to the carrier.

19 Claims, 8 Drawing Sheets

(51) Int. Cl.
   *H01L 23/00*      (2006.01)
   *H01L 23/13*      (2006.01)
   *H01L 25/00*      (2006.01)
   *H01L 23/495*     (2006.01)
   *H01L 21/683*     (2006.01)
   *H01L 23/544*     (2006.01)

(52) U.S. Cl.
   CPC ............... *H01L 2224/05139* (2013.01); *H01L 2224/05144* (2013.01); *H01L 2224/05147* (2013.01); *H01L 2224/05166* (2013.01); *H01L 2224/05171* (2013.01); *H01L 2224/05184* (2013.01); *H01L 2224/05624* (2013.01); *H01L 2224/05639* (2013.01); *H01L 2224/05647* (2013.01); *H01L 2224/05655* (2013.01); *H01L 2224/05666* (2013.01); *H01L 2224/05684* (2013.01); *H01L 2224/05687* (2013.01); *H01L 2224/06183* (2013.01); *H01L 2224/26145* (2013.01); *H01L 2224/26175* (2013.01); *H01L 2224/2743* (2013.01); *H01L 2224/27334* (2013.01); *H01L 2224/291* (2013.01); *H01L 2224/293* (2013.01); *H01L 2224/2908* (2013.01); *H01L 2224/2916* (2013.01); *H01L 2224/2919* (2013.01); *H01L 2224/29105* (2013.01); *H01L 2224/29109* (2013.01); *H01L 2224/29111* (2013.01); *H01L 2224/29113* (2013.01); *H01L 2224/29116* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/29166* (2013.01); *H01L 2224/29171* (2013.01); *H01L 2224/29294* (2013.01); *H01L 2224/29339* (2013.01); *H01L 2224/29347* (2013.01); *H01L 2224/32225* (2013.01); *H01L 2224/32245* (2013.01); *H01L 2224/32503* (2013.01); *H01L 2224/7598* (2013.01); *H01L 2224/75102* (2013.01); *H01L 2224/75251* (2013.01); *H01L 2224/75265* (2013.01); *H01L 2224/75303* (2013.01); *H01L 2224/75753* (2013.01); *H01L 2224/83002* (2013.01); *H01L 2224/83005* (2013.01); *H01L 2224/83007* (2013.01); *H01L 2224/8309* (2013.01); *H01L 2224/83024* (2013.01); *H01L 2224/8346* (2013.01); *H01L 2224/83055* (2013.01); *H01L 2224/83065* (2013.01); *H01L 2224/83075* (2013.01); *H01L 2224/8381* (2013.01); *H01L 2224/8382* (2013.01); *H01L 2224/8384* (2013.01); *H01L 2224/83091* (2013.01); *H01L 2224/83092* (2013.01); *H01L 2224/83101* (2013.01); *H01L 2224/83127* (2013.01); *H01L 2224/83132* (2013.01); *H01L 2224/83143* (2013.01); *H01L 2224/83191* (2013.01); *H01L 2224/83192* (2013.01); *H01L 2224/83193* (2013.01); *H01L 2224/83201* (2013.01); *H01L 2224/83203* (2013.01); *H01L 2224/83208* (2013.01); *H01L 2224/83222* (2013.01); *H01L 2224/83385* (2013.01); *H01L 2224/83424* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83466* (2013.01); *H01L 2224/83469* (2013.01); *H01L 2224/83815* (2013.01); *H01L 2224/83825* (2013.01); *H01L 2224/83851* (2013.01); *H01L 2224/83855* (2013.01); *H01L 2224/83856* (2013.01); *H01L 2224/83862* (2013.01); *H01L 2224/83907* (2013.01); *H01L 2224/83986* (2013.01); *H01L 2224/97* (2013.01); *H01L 2924/00012* (2013.01); *H01L 2924/01015* (2013.01); *H01L 2924/0496* (2013.01); *H01L 2924/04941* (2013.01); *H01L 2924/157* (2013.01); *H01L 2924/1576* (2013.01); *H01L 2924/1579* (2013.01); *H01L 2924/15153* (2013.01); *H01L 2924/15156* (2013.01); *H01L 2924/15157* (2013.01); *H01L 2924/15747* (2013.01); *H01L 2924/15787* (2013.01); *H01L 2924/15788* (2013.01)

(56) References Cited

U.S. PATENT DOCUMENTS

| | | | |
|---|---|---|---|
| 2009/0230524 A1* | 9/2009 | Chien | H01L 21/4832 257/676 |
| 2012/0018772 A1* | 1/2012 | Nishijima | H01L 33/486 257/99 |
| 2012/0107552 A1* | 5/2012 | Tellkamp | C09J 9/02 428/119 |
| 2012/0168206 A1* | 7/2012 | Sekine | H01L 21/486 174/252 |
| 2012/0267758 A1* | 10/2012 | Shroff | H01L 29/66181 257/532 |
| 2013/0294471 A1* | 11/2013 | Palaniswamy | H01L 33/486 372/43.01 |
| 2015/0262928 A1* | 9/2015 | Shen | H01L 23/315 257/676 |

* cited by examiner

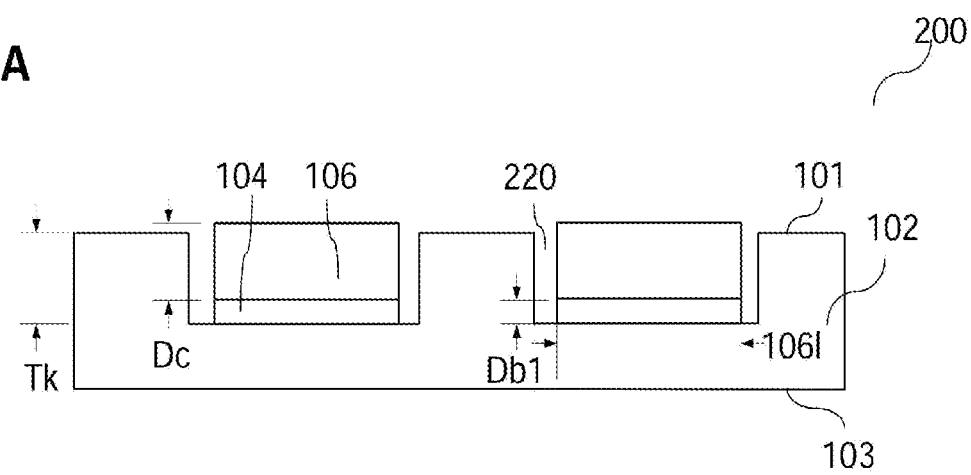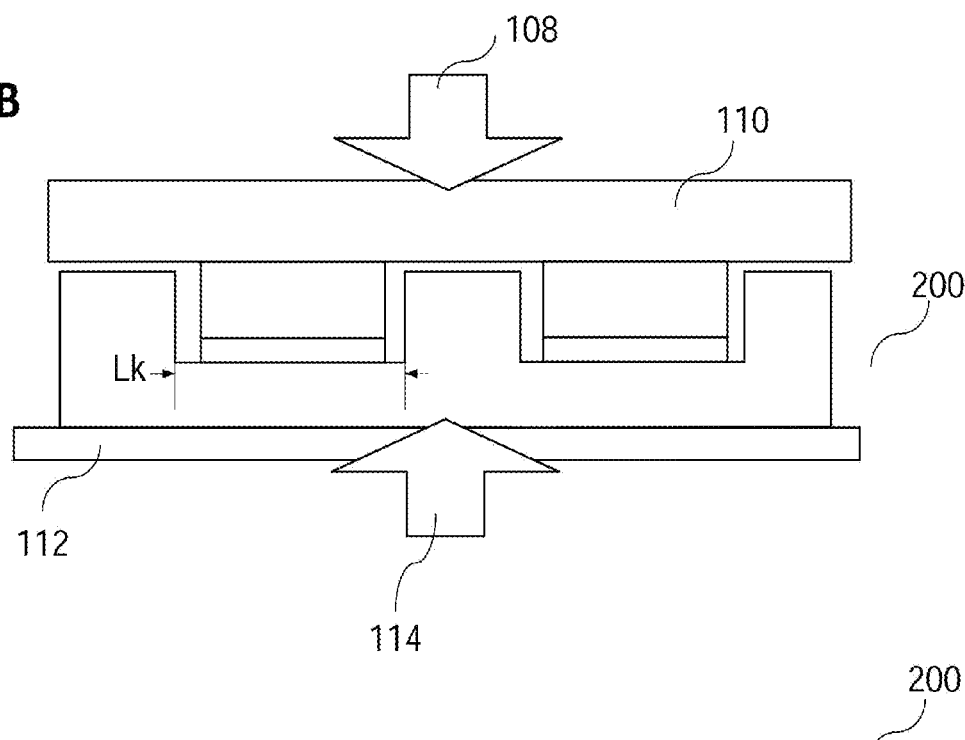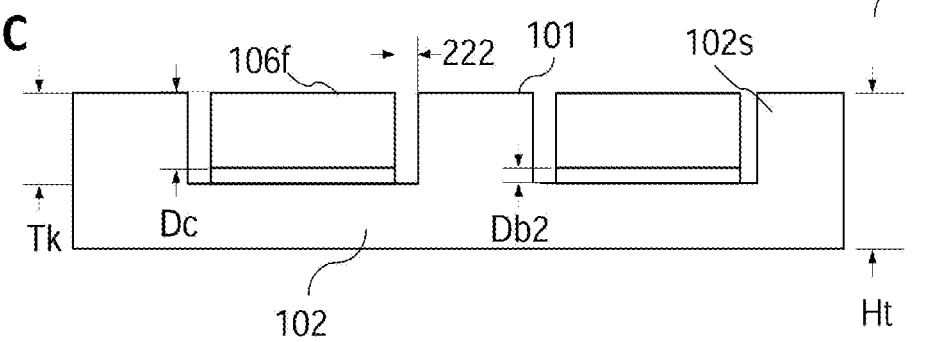

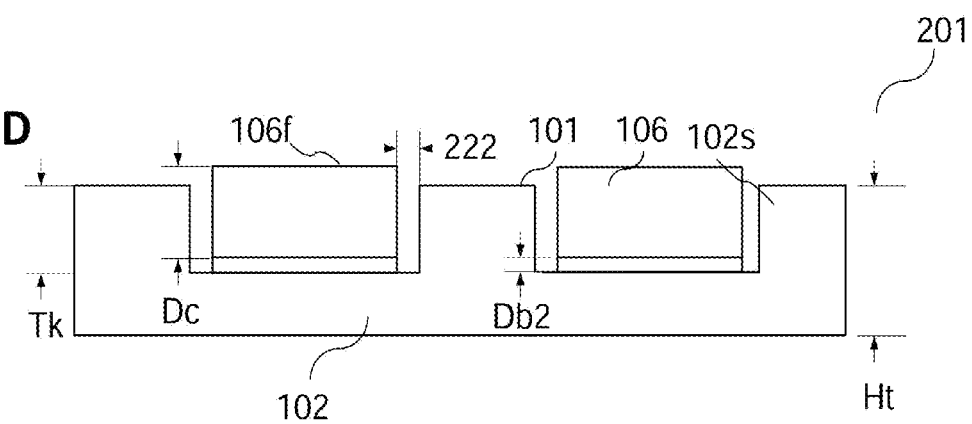
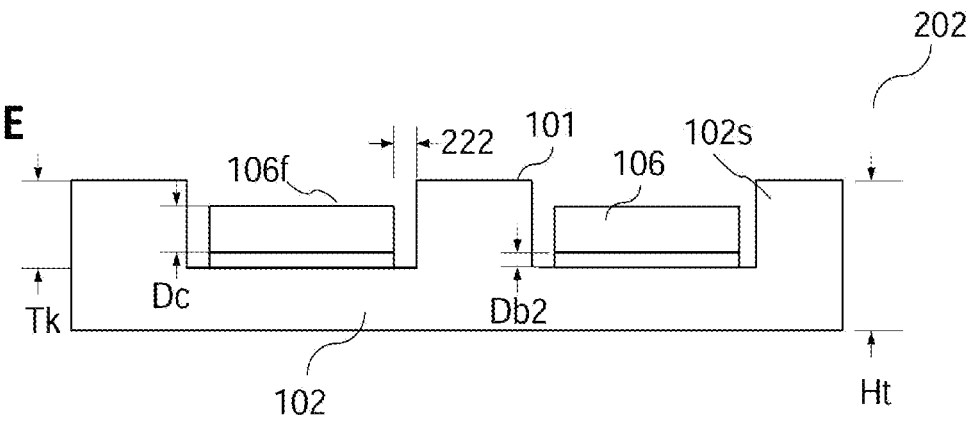

CHIP ASSEMBLY

CROSS-REFERENCE TO RELATED APPLICATION

This application is a Divisional of U.S. patent application Ser. No. 14/870,064, filed Sep. 30, 2015, which claims priority to German Patent Application Serial No. 10 2014 114 982.3, filed Oct. 15, 2014, which are incorporated herein by reference in their entirety.

TECHNICAL FIELD

Various embodiments generally relate to a method of forming a chip assembly and to a chip assembly.

BACKGROUND

For processing or/and use, individual chips (also referred to as dies) may typically be placed and fixed on a common carrier, for example on a leadframe. For this, a device may be used that first picks a chip and places it on the carrier, then fixes the chip to the carrier. After that, the device may pick the next chip, place it on the carrier and fix it to the carrier. This is a very time consuming process, because each chip is treated individually and because, after the fixing of one of the chips to the carrier, the placing of the next chip cannot be done immediately: air surrounding the chips and the carrier is heated up by the fixing process, and a settling of the air has to be awaited first, otherwise an image taken by an imaging system for determining the target region will be too distorted by the hot, moving air to allow for a precise placement of the chip.

In an alternative method for attaching a chip to a carrier, an intermediate carrier may be used. The chips may be placed top-down on the intermediate carrier, for example on a carrier with an adhesive tape. Subsequently, the carrier, for example the leadframe, may be placed on the chips, i.e. on backsides of the chips, while the chips are held in place on the intermediate carrier by the adhesive tape. Then, the stack (the assembly) of intermediate carrier, adhesive tape, chip and carrier (leadframe) may be transferred to a heated press and be subjected to a hot die attach process for fixing the chips to the carrier.

While the alternative method avoids a one-by-one fixing of the chips to the carrier and consequently may be able to save time, it requires an intermediate carrier. The adhesive tape used to hold the carriers in place may only be used once, in order to avoid contaminations. This may lead to relatively high material costs per carrier, e.g. per lead frame. While such a method may be useful if a large number of chips has to be arranged on a leadframe, arranging a relatively small number of chips on a relatively large leadframe using this method may be cost prohibitive.

SUMMARY

A method of forming a chip assembly may include forming a plurality of cavities in a carrier; The method may further include arranging a die attach liquid in each of the cavities; arranging a plurality of chips on the die attach liquid, each chip comprising a rear side metallization and a rear side interconnect material disposed over the rear side metallization; evaporating the die attach liquid; and after the evaporating the die attach liquid, fixing the plurality of chips to the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A to FIG. 2E show a chip assembly at various stages of its formation by means of a method of forming a chip assembly according to various embodiments;

DESCRIPTION

Figure 1A:
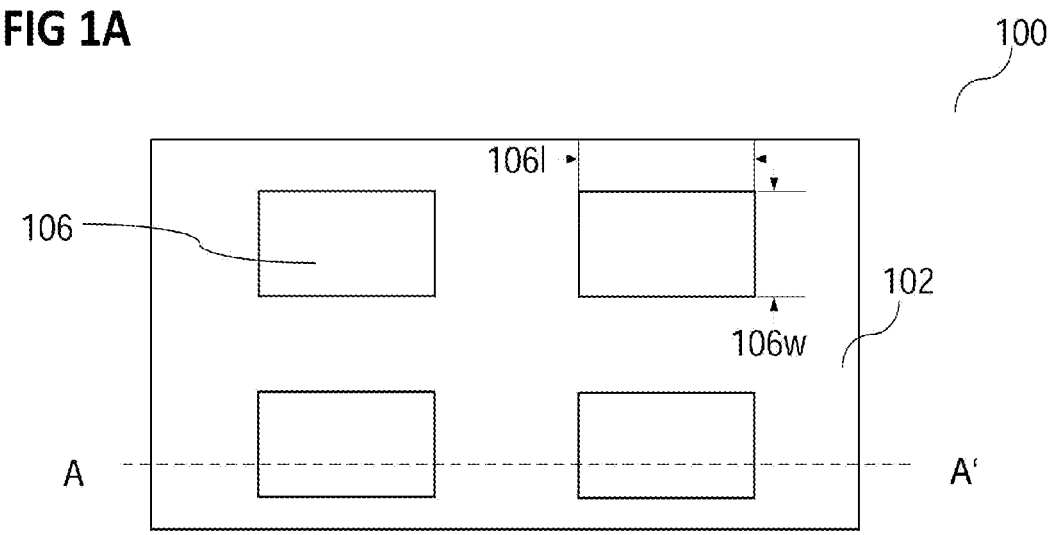
FIG. 1A to FIG. 1C show a chip assembly at various stages of its formation by means of a method of forming a chip assembly according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments of a method for forming a chip assembly, placement of a plurality of chips on a common carrier is followed by a common fixing step. Sequential placement and fixing of individual chips on the carrier is avoided, as is the process of transferring the chips onto an intermediate carrier for simultaneous placement on the carrier. Thereby production costs may be reduced. Furthermore, a process of positioning the (final) carrier on the intermediate carrier with the chips and a process of removing the intermediate carrier after the fixing of the chips to the carrier may be avoided. Consequently, processing time may be saved.

In other words, the method for forming a chip assembly may allow for a fast forming of the chip assembly, while at the same time avoiding extra costs that using an extra intermediate carrier would incur. This may be achieved by individually placing a plurality of chips directly on a common carrier and by then fixing the plurality of chips to the carrier in at least one common process.

In various embodiments, a chip attachment process may be made possible in which a die placement is separated from a formation of a connection between the chip and the carrier (e.g. a leadframe or a substrate) without using an intermediate carrier for the chips.

In various embodiments, a displacement of the chips that are arranged on the common carrier, for example during a transfer of the carrier with the chips to an area where the chips may be fixed to the carrier, may be avoided by means of a holding force. In other words, the holding force may essentially hold the plurality of chips in their respective places on the carrier until they are securely fixed to the carrier by means of a fixing device.

In various embodiments, the holding force between the carrier and the chip may be an adhesive force, for example a mechanically adhesive force, exerted by an adhesive formed on the chip, for example by an electrically conductive adhesive, for example an electrically conductive glue.

In various embodiments, the holding force may be an adhesive force, for example a dispersive adhesive force, exerted by means of a liquid disposed between the carrier and each of the chips. The liquid may for example be disposed as separate volumes of liquid that may be arranged in each of a plurality of cavities formed in the carrier. The liquid may be removed, for example by means of evaporation, before the plurality of chips is fixed to the carrier.

In various embodiments, the fixing of the plurality of chips to the carrier may establish an electrically conductive connection and/or a thermally conductive connection between the carrier and each of the chips.

In various embodiments, each chip of the plurality of chips may include an electrically conductive material. The electrically conductive material may be disposed on a back side of the chip, which may also be referred to as the rear side of the chip, wherein the back side of each of the chips may be the side that is fixed on the carrier, and a front side of each of the chips may be opposite the back side. The electrically conductive material may for example be or include a solder, for example a diffusion solder or a solder layer, a sinter paste, a sinter layer, a bistage material, a wafer backside coating glue, a conductive die attach film, a conductive adhesive, for example an electrically conductive glue, or the like. The electrically conductive material may be configured to fix the respective chip to the carrier, for example after heating up the electrically conductive material (and possibly the carrier and/or the chip) and/or exerting a force on the plurality of chips and/or on the carrier directed at pressing each of the chips onto the carrier. The electrically conductive material that is configured to fix the chip to the carrier may also be referred to as an interconnect material. The electrically conductive material may be arranged on each of the chips for example as a layer, for example as a continuous layer or as a structured layer. In that case, the interconnect material may be referred to as a rear side interconnect material. In other words, the front side and the rear side may be different and/or distinguishable.

In various embodiments, the electrically conductive material disposed on, e.g. directly on, the back side of the chip may include a metallization that is not itself configured to fix the chip to the carrier. The metallization may for example be configured to provide an electrical and/or thermal contact to one or more components of the chip, and/or to improve a fixing of the chip to the carrier, for example by providing an electrically conductive surface that is better suited for anchoring the interconnect material than a surface of the chip without the metallization, and it may be firmly connected to the rear side of the chip. It may be referred to as rear side metallization. In other words, each chip may include the rear side metallization and the rear side interconnect material formed over the rear side metallization.

In various embodiments, additionally or alternatively, an electrically conductive material may be formed on the carrier. The electrically conductive material may for example be a solder, for example a diffusion solder, a solder layer, a solder paste, a bistage material, a sinter paste, a sinter layer, a wafer backside coating glue, a conductive die attach film, a conductive adhesive, or the like, and it may have the same properties as the interconnect material described above. It may be referred to as a carrier interconnect material.

In the following, when the interconnect material is referred to without specifying whether it refers to the rear side interconnect material or to the carrier interconnect material, the interconnect material may be formed on the rear side of the chip, on the carrier, or both. In other words, in most cases, it may be irrelevant whether the interconnect material is formed on the back side of the chip, on the carrier (e.g. on the bottom of the cavity), or on both. For some stacks of layers of interconnect material, e.g. including a plurality of materials, a sequence in which the layers with their respective materials are stacked may be important.

The bistage material may be a material that is flexible when applied, e.g. applied on a surface, e.g. on the rear side of the chip or on the carrier, and hardening during a thermal treatment. In its hardened state, it may act as a solder and/or as an adhesive and be used accordingly.

The sinter paste may be a paste including particles with a size in a nanometer or micrometer range (they may be referred to as nano paste or micro paste, respectively). The paste may further include a paste-like base material. A material of the particles may for example be or include silver and/or copper. The sinter paste may be a silver, copper or silver/copper nano paste or a silver, copper or silver/copper micro paste. The sinter paste may be used for forming a sinter layer. For example, the sinter paste may be applied to a surface as a layer, e.g. a continuous layer or a structured layer. The layer of sinter paste may then (possibly after or during an, e.g. thermal, removal of the base material) be sintered, forming a sinter layer.

The interconnect material (i.e., the rear side interconnect material, the carrier interconnect material or both) may include at least one of a group consisting of tin, zinc, silver, indium, gallium, bismuth, gold, lead, nickel, and copper. The interconnect material may for example be an alloy including one or more of the materials. The interconnect material may for example be or include a tin-silver-alloy, a nickel-iron-alloy (e.g. an alloy referred to as alloy 42 with a nickel content of 42%), a gold-tin-alloy, or a tin-silver-lead alloy. The interconnect material may be formed as a stack of layers of interconnect materials.

Alternatively, the electrically conductive material formed on the carrier may be a material that is not itself configured to fix the chip to the carrier. It may for example be a material that promotes a fixing of the chip to the carrier, for example by providing an electrically conductive surface that is better suited for anchoring the interconnect material than a surface of the carrier, and it may be firmly connected to the carrier. As another example, the electrically conductive material arranged on the carrier may include any other electrically conductive material, for example a metal or a metal alloy, for example copper, aluminum, nickel, gold, platinum, palladium or silver. This may for example be the case if the carrier includes a non-conductive material, for example a polymer or ceramics. The electrically conductive material may be arranged on the carrier for example as a layer, for example as a continuous layer or as a structured layer.

In various embodiments, surfaces of chip side walls, which are the sides of the chip connecting the front and the back side of each chip, may be coated. A coating material may be configured to prevent an electrical contact between the chip side and a side wall of the cavity in which the respective chip may be arranged. Alternatively or additionally, the coating may be configured to prevent or alleviate a wetting of the chip sides with the liquid on which the chip may be arranged on the carrier. The coating material may for example be a dielectric coating. It may for example include or essentially consist of polyimide. In various embodiments, the coating material may be configured to act as a barrier, for example as a diffusion barrier preventing or alleviating a diffusion of the interconnect material into the chip or of chip material into the interconnect material. In that case, the coating may include one or more of the materials typically used for diffusion barriers, for example a metal coating, e.g. nickel, copper, aluminum or tungsten, or a conductive ceramics coating, such as titanium nitride or tungsten nitride.

In various embodiments, one or more of surfaces of the side walls of the plurality of cavities in which the plurality of chips may be arranged may be coated. A coating material may be configured to prevent an electrical contact between the chip side and the side wall of the cavity in which the respective chip may be arranged. Alternatively or additionally, the coating may be configured to prevent or alleviate a wetting of the cavity side walls with the liquid on which the chip may be arranged in the cavity. The coating material may for example be a dielectric coating. It may for example include or essentially consist of polyimide. In various embodiments, the coating material may be configured to act as a barrier, for example as a diffusion barrier preventing or alleviating a diffusion of the interconnect material into the chip or of chip material into the interconnect material. In that case, the coating may include one or more of the materials typically used for diffusion barriers, for example a metal coating, e.g. nickel, copper, aluminum or tungsten, or a conductive ceramics coating, such as titanium nitride or tungsten nitride. In various embodiments, the coating may be confictured to improve a wetting and/or a formation of an intermetallic compound. The coating may for example be a metallic coating. The material of the metallic coating may for example include at least one of a group consisting of copper, silver, nickel, gold, platinum, palladium, and alloys thereof. The coating for the improvement of the wetting and/or of the formation of an intermetallic compound may additionally be formed on the bottom of the cavity or at least on a part of the bottom of the cavity.

In various embodiments, the interconnect material (i.e. the rear side interconnect material, the carrier interconnect material or both) may include a silver or copper nano or micro paste, a single metal (also referred to as mono metal, e.g. tin or lead), an alloy, for example a silver-tin-alloy or a silver, tin and lead alloy, and/or a stack of layers of interconnect material.

In various embodiments, the stack of layers of interconnect material may be a stack that is not only configured to fix the chip to the carrier, but also to provide e.g. a thermomechanical buffer function, by selecting a specific combination and/or succession of layer materials. As a first example, in a sequence as seen from the chip, the stack of layers of interconnect material may include an aluminum layer configured to contact the chip, a titanium layer, a silver layer, a layer of gold/tin, e.g. a gold-tin-alloy, and another silver layer, wherein the other silver layer may be configured to contact the carrier. In a second example, in a sequence as seen from the chip, the stack of layers may include an aluminum layer configured to contact the chip, a titanium layer, a copper layer, a tin layer, and another copper layer, wherein the other copper layer may be configured to contact the carrier. In a third example, in a sequence as seen from the chip, the stack of layers may include an aluminum or titanium layer configured to contact the chip, a titanium, titanium-tungsten or tungsten layer, a copper or silver layer, a tin layer, an optionally a very thin (order of nanometers) silver or gold layer, which may act as a protective layer. Here, the tin layer may be configured to contact the carrier, after the protective layer essentially vanishes during the fixing of the chip to the carrier. In a fourth example, the stack of layers may include a tin layer and a silver layer. In a fifth example, the stack of layers may include a tin layer, a silver layer and a lead layer. In various embodiments, the stack of layers of interconnect material may be formed on the back side of the chip, thereby forming the rear side interconnect material. In various embodiments, the stack of layers of interconnect material may be formed on the carrier, thereby forming the carrier interconnect material. In various embodiments, the stack of layers may be partially formed on the back side of the chip, and partially on the carrier. For example, in the first example, the aluminum and the titanium layer may be formed on the rear side of the chip, and the rest of the stack of layers of interconnect material, i.e. the silver layer, the gold/tin-layer and the other silver layer may be formed on the carrier.

A method of forming a chip assembly may include forming a plurality of cavities in a carrier. The method may further include arranging a die attach liquid in each of the cavities; arranging a plurality of chips on the die attach liquid, each chip including a rear side metallization and a rear side interconnect material disposed over the rear side metallization; evaporating the die attach liquid; and after the evaporating the die attach liquid, fixing the plurality of chips to the carrier. In other words: the plurality of chips, after having arranged them on the die attach liquid, may remain on the die attach liquid upon the evaporation on the die attach liquid.

A method of forming a chip assembly may include forming a plurality of cavities in a carrier; The method may further include arranging a die attach liquid in each of the cavities; arranging a plurality of chips on the die attach liquid, each chip including a rear side metallization and a rear side interconnect material disposed over the rear side metallization, wherein the rear side interconnect material faces the carrier; evaporating the die attach liquid; and after the evaporating the die attach liquid, fixing the plurality of chips to the carrier.

In various embodiments, a method of forming a chip assembly may include individually arranging a plurality of chips on a common carrier, and, after the arranging of the chips, fixing the plurality of chips to the carrier in at least one common process.

In various embodiments, the method may further include forming a plurality of cavities in the carrier. The arranging the plurality of chips on the carrier may include arranging each of the plurality of chips in one of the cavities.

In various embodiments, the method may further include, before the arranging of the plurality of chips, arranging a die attach liquid in each of the cavities, and, before the fixing of the plurality of chips to the carrier, evaporating the die attach liquid.

In various embodiments, each of the plurality of chips may include an interconnect material. Each chip of the plurality of chips may be arranged with the interconnect material facing the carrier. In various embodiments, the rear side interconnect material may include at least one of a group consisting of: a solder, e.g. a diffusion solder, a solder paste, or a solder layer, a bistage material, a wafer backside coating glue, a conductive die attach film, a sinter paste, a sinter layer and an adhesive. In various embodiments, the rear side interconnect material may include at least one of a group consisting of: tin, silver, indium, gallium, bismuth, gold, and copper.

In various embodiments, the rear side interconnect material may include at least one material or a plurality of materials in a stack of layers of a group consisting of tin (Sn); tin and silver (SnAg); indium (In); indium and tin (InSn); indium and silver (InAg); gold and tin (AuSn); aluminum (Al), titanium (Ti), copper (Cu), tin (Sn) and silver (Ag); titanium (Ti), copper (Cu), tin (Sn) and silver (Ag); aluminum (Al), titanium (Ti), nickel (Ni), tin (Sn) and silver (Ag); titanium (Ti), nickel (Ni), tin (Sn) and silver (Ag); aluminum (Al), chromium (Cr), copper (Cu), tin (Sn) and silver (Ag); chromium (Cr), copper (Cu), tin (Sn) and silver (Ag); aluminum (Al), chromium (Cr), nickel (Ni), tin (Sn) and silver (Ag); chromium (Cr), nickel (Ni), tin (Sn) and silver (Ag); titanium (Ti) and a gold-tin-alloy (AuSn); aluminum (Al), titanium (Ti) and a gold-tin-alloy (AuSn); titanium (Ti), a nickel-vanadium-alloy (NiV) and a gold-tin-alloy (AuSn); aluminum (Al), titanium (Ti), a nickel-vanadium-alloy (NiV), and a gold-tin-alloy (AuSn); titanium (Ti), copper (Cu) and a silver-tin-alloy (AgSn); aluminum (Al), titanium (Ti), copper (Cu) and a silver-tin-alloy (AgSn); titanium (Ti), nickel (Ni) and a silver-tin-alloy (AgSn); aluminum (Al), titanium (Ti), nickel (Ni) and a silver-tin-alloy (AgSn); and indium-tin/indium. In a case where the interconnect material may include a plurality of layers of different materials, the layers may be formed over the carrier in the described sequence.

In various embodiments, the method may further include holding the plurality of chips, by means of the rear side interconnect material, in respective positions in which they are arranged.

In various embodiments, the evaporating of the die attach liquid may include heating the chip assembly. The heating of the chip assembly may include heating the chip assembly to a temperature that is at least as high as an evaporation temperature of the die attach liquid and lower than a melting temperature of the interconnect material.

In various embodiments, the die attach liquid may evaporate essentially completely.

In various embodiments, the die attach liquid may include any liquid that does not react strongly with the rear side interconnect material and evaporates completely at a temperature lower than a fusing temperature of the rear side interconnect material. The die attach liquid may for example include or consist of alcohol, secondary alcohol, purified water, organofluorine compounds like perfluorocarbon (PFC) or hydrofluororther (HFE). In various embodiments, the fixing the plurality of chips to the carrier may include heating the chip assembly. The heating the chip assembly may include heating to a temperature that is at least as high as the melting temperature of the rear side interconnect material.

In various embodiments, the fixing the plurality of chips to the carrier may include diffusion soldering.

In various embodiments, the fixing the plurality of chips to the carrier may include pressing the plurality of chips onto the carrier. The fixing the plurality of chips to the carrier may include pressing the plurality of chips onto the carrier until the plurality of chips is flush with a top side of the carrier outside the cavities.

In various embodiments, the plurality of chips may not be flush with a top side of the carrier outside the cavities. For example, at least some chips of the plurality of chips may at least partially protrude from the respective cavities they are arranged in. Alternatively, a thickness of the chip may be smaller than a depth of the cavity. In other words, after the arranging the plurality of chips in the plurality of cavities, at least some chips of the plurality of chips may each be arranged completely inside its respective cavity, wherein the front side of the chip may not reach a level of the top side of the carrier outside the cavity.

In various embodiments, at least the fixing the plurality of chips to the carrier may be carried out in vacuum.

In various embodiments, at least the fixing the plurality of chips to the carrier may be carried out in a reactive atmosphere. The reactive atmosphere may consist of any atmosphere that is capable of removing oxides. The reactive atmosphere may for example include or essentially consist of formic acid or forming gas.

In various embodiments, the forming the plurality of cavities in the carrier may include forming the plurality of cavities with side walls inclined away from the cavity in a direction from a bottom of the cavity to a top of the cavity.

In various embodiments, the forming the plurality of cavities in the carrier may include forming the plurality of cavities with a channel at a bottom of each of the plurality of cavities.

In various embodiments, the forming the plurality of cavities in the carrier may include forming the plurality of cavities with a concave shape at side walls of each of the plurality of cavities. In various embodiments, the forming the plurality of cavities in the carrier may include forming the plurality of cavities with a concave shape at a bottom of each of the plurality of cavities.

In various embodiments, the method may further include forming an interconnect material repellent coating on at least one of side walls of the plurality of cavities and side walls of the plurality of chips.

In various embodiments, forming the plurality of cavities in the carrier may include forming the plurality of cavities with a concave shape at side walls of each of the plurality of cavities. In various embodiments, the forming the plurality of cavities in the carrier may include forming the plurality of cavities with a concave shape at a bottom of each of the plurality of cavities.

A method of forming a chip assembly may include forming a plurality of cavities in a carrier; disposing a carrier interconnect material over a bottom of each of the cavities; arranging a die attach liquid in each of the cavities; arranging a plurality of chips on the die attach liquid, each chip comprising a rear side metallization; evaporating the die attach liquid; and after the evaporating the die attach liquid, fixing the plurality of chips to the carrier.

In various embodiments, the carrier interconnect material may include at least one of a group consisting of a solder; a solder layer; a back side coating solder paste; a wafer backside coating glue; a conductive die attach film; a sinter paste; a sinter layer; a bistage material; an adhesive; an adhesive foil; an adhesive layer; and a metal.

In various embodiments, the metal may be one of a group consisting of silver; nickel; full nickel and nickel phosphorus; nickel phosphorus; gold; platinum; palladium; and copper.

In various embodiments, the carrier interconnect material may include at least one material or a plurality of materials in a stack of layers of a group consisting of tin (Sn); tin and silver (SnAg); indium (In); indium and tin (InSn); indium and silver (InAg); gold and tin (AuSn); aluminum (Al), titanium (Ti), copper (Cu), tin (Sn) and silver (Ag); titanium (Ti), copper (Cu), tin (Sn) and silver (Ag); aluminum (Al), titanium (Ti), nickel (Ni), tin (Sn) and silver (Ag); titanium (Ti), nickel (Ni), tin (Sn) and silver (Ag); aluminum (Al), chromium (Cr), copper (Cu), tin (Sn) and silver (Ag); chromium (Cr), copper (Cu), tin (Sn) and silver (Ag); aluminum (Al), chromium (Cr), nickel (Ni), tin (Sn) and silver (Ag); chromium (Cr), nickel (Ni), tin (Sn) and silver (Ag); titanium (Ti) and a gold-tin-alloy (AuSn); aluminum (Al), titanium (Ti) and a gold-tin-alloy (AuSn); titanium (Ti), a nickel-vanadium-alloy (NiV) and a gold-tin-alloy (AuSn); aluminum (Al), titanium (Ti), a nickel-vanadium-alloy (NiV), and a gold-tin-alloy (AuSn); titanium (Ti), copper (Cu) and a silver-tin-alloy (AgSn); aluminum (Al), titanium (Ti), copper (Cu) and a silver-tin-alloy (AgSn); titanium (Ti), nickel (Ni) and a silver-tin-alloy (AgSn); aluminum (Al), titanium (Ti), nickel (Ni) and a silver-tin-alloy (AgSn); and indium-tin/indium. In a case where the interconnect material may include a plurality of layers of different materials, the layers may be formed over the carrier in the described sequence.

In various embodiments, a chip assembly may include a carrier with a top side comprising a plurality of cavities formed in the top side of the carrier, each cavity configured to receive a chip. The chip assembly may further include a plurality of chips, each chip being arranged in an associated cavity of the plurality of cavities, and each chip comprising a chip contact being fixed to the bottom of the associated cavity. The top side of the carrier outside the cavities may be flush with the plurality of chips. Alternatively, the top side of the carrier outside the cavities may not be flush with the plurality of chips.

In various embodiments, side walls of the plurality of cavities may be inclined away from the cavity in a direction from a bottom of the cavity to a top of the cavity.

In various embodiments, the plurality of cavities may be formed with a channel at a bottom of each of the plurality of cavities.

In various embodiments in which the carrier outside the cavities may not be flush with the plurality of chips, at least some chips of the plurality of chips may protrude from the respective cavity they are arranged in.

In various embodiments in which the carrier outside the cavities may not be flush with the plurality of chips, at least some chips of the plurality of chips may have a thickness that is smaller than a depth of the respective cavity they are arranged in.

Figure 1B:
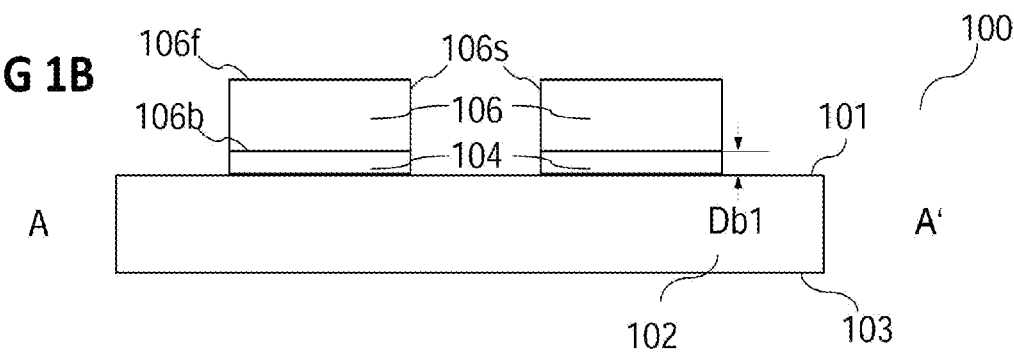
Figure 1C:
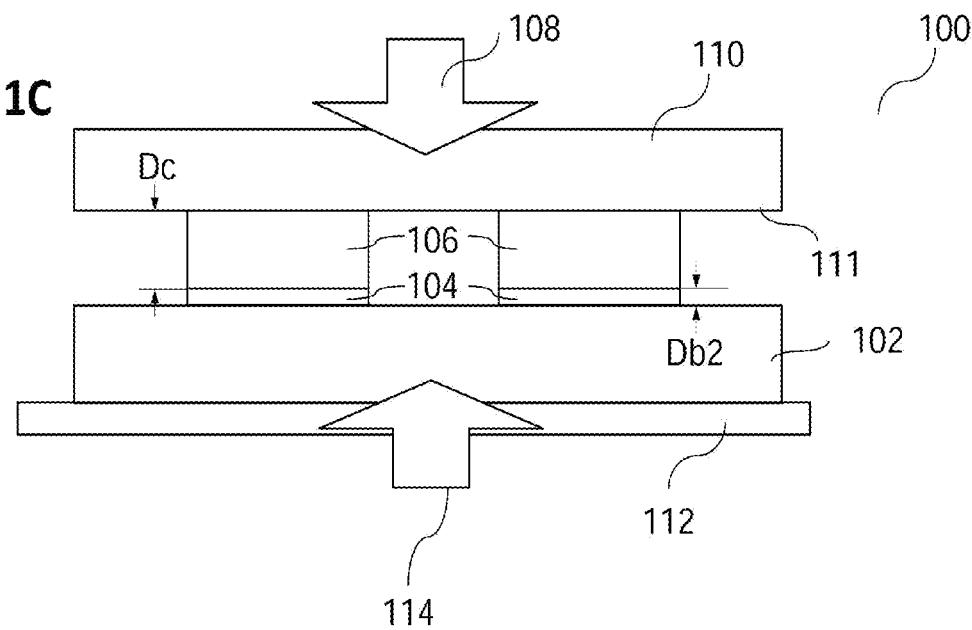

FIG. 1A to FIG. 1C show a chip assembly 100 at various stages of its formation by means of a method of forming a chip assembly according to various embodiments.

In various embodiments, as shown in FIG. 1A, a carrier 102 may be provided. The carrier 102 may be configured to have a plurality of chips 106 arranged thereon. The carrier 102 may have a top side 101 (as shown in FIG. 1B, which is a cross section of FIG. 1A along the line A-A'). An area of the top side 101 of the carrier 102 may be large enough to accommodate the plurality of chips 106. The carrier 102 may have a bottom side 103 that may be opposite the top side 101.

A material of the carrier 102 may be or include any material that is suitable for a carrier that is configured to have a plurality of chips 106 arranged thereon. The material of the carrier may for example be a stiff material. The material of the carrier may for example include or essentially consist of a conductive material, for example a metal, for example copper, a copper alloy, a ferrous alloy, for example a ferrous alloy comprising nickel, cobalt or chromium, nickel, a nickel alloy or aluminum, for example a nickel-iron alloy referred to as Alloy42 (containing 42% of nickel). The carrier 102 may for example be a leadframe. The carrier 102 that may include or essentially consist of copper may for example be configured for direct copper bonding. In various embodiments, the material of the carrier 102 may be or include a dielectric or semiconductive material, for example silicon, ceramics, glass or a polymer, for example a resin. In various embodiments, for example in case of a bulk material of the carrier 102 being or including the semiconductive or dielectric material, but also in a case where the bulk material of the carrier 102 is electrically conductive, the carrier 102 may further include a (further) conductive material, for example a conductive layer, for example a continuous conductive layer or a structured conductive layer, for example a metal layer. In the case of the conductive bulk material, the further conductive material may for example be different from the conductive bulk material of the carrier 102. The carrier 102 may for example be a printed circuit board (PCB). In another example, the material of the carrier 102 may be a flexible material, for example a polymer, for example polyimide. The carrier 102 may for example be a flexible PCB.

In various embodiments, a plurality of chips 106 may be arranged on the carrier 102. In other words, the carrier 102 may be a common carrier 102 for the plurality of chips 106 being arranged thereon. Each chip 106 of the plurality of chips 106, as shown in FIG. 1A and in FIG. 1B, may have a front side 106f and a back side 106b opposite the front side. Sides of the chip 106 connecting the front side 106f and the back side 106b of the chip 106 may be referred to as side walls 106s, chip sides 106s or sides 106s for short. Each chip 106 of the plurality of chips 106 may have a width 106w and a length 106l.

In various embodiments, the plurality of chips 106 may include two or more chips 106. Even though an assembly including four chips 106 is shown in FIG. 1A, the chip assembly 100 may include any number of chips 106 that is two or more. The plurality of chips 106 may simply be referred to as "the chips". Unless indicated otherwise, a description of a single chip 106 (e.g. "each chip", "the chip") in the following refers to one chip 106 as an element or a representative of the plurality of chips 106.

In various embodiments, the plurality of chips 106 may be arranged on the carrier 102. The chips 106 may be arranged with their back sides 106b facing towards the carrier 102. The chips 106 may be arranged on the top side 101 of the carrier 102. The chips 106 may be arranged on the carrier 102 essentially side-by-side, with some space between the individual chips 106. The arrangement of the plurality of chips 106 may form a line, a two-dimensional regular pattern, for example a grid, a two-dimensional irregular pattern, or any other kind of arrangement.

In various embodiments, the plurality of chips 106 may be individually arranged on the carrier 102. In other words, each chip 106 of the plurality of chips 106 may be individually picked up, for example from a reservoir (not shown) of chips 106, for example by means of a pick-and-place device (not shown), and may then be placed on the carrier 102. Each chip 106 of the plurality of chips 106 may be placed in a respective target position for the respective chip 106. In a case of several of the chips 106 being identical, their respective target positions may be interchangeable. For different chips 106, their respective target positions may not be interchangeable.

In various embodiments, the individual arranging of the plurality of chips 106 directly on the carrier 102 to which they are intended to be fixed may avoid using an intermediate carrier for a common transfer of the plurality of chips 106 to the carrier 102. Such an intermediate carrier and/or an adhesive, for example an adhesive tape arranged on it, would typically be used only once, in order to avoid contaminations. Making such an intermediate carrier superfluous therefore may reduce processing costs. Furthermore, a usage of an intermediate carrier requires additional processing, for example a combining of the chip 106 arrangement with the carrier 102 and, after the fixing of the chips 106 to the carrier 102, a removal of the intermediate carrier. Consequently, processing time may be shorter in a process that avoids using an intermediate carrier.

In various embodiments, the arranging of the plurality of chips 106 on the carrier 102, for example the individual arranging of the plurality of the chips 106, may be carried out at essentially atmospheric pressure and/or at essentially room temperature. In other words, the arranging of the chips 106 on the carrier 102 may be carried out in an environment that does not need to be evacuated, heated or cooled. The arranging of the plurality of chips 106 on the carrier 102 may not benefit from a vacuum environment. Consequently, a process sequence that does not lead to the chips 106 having to be arranged on the carrier 102 in vacuum may save processing costs as compared to a processing where the arranging of the chips 106 would have to be conducted in vacuum (for example if, in the process described above with each individual chip being arranged and soldered to the carrier before arranging the next chip, the soldering of the chip to the carrier was to be carried out in vacuum, for example for improving a quality of the soldering connection, and due to the interleaved processing sequence of arranging and fixing of the chips, also the arranging would have to be conducted in vacuum, requiring a large volume to be evacuated).

The arranging of the plurality of chips 106 on the common carrier 102 at room temperature at essentially atmospheric pressure may be performed faster than an arranging at elevated temperature (for example at melting temperature of the solder) at atmospheric pressure, because hot air between the carrier 102 and an imaging system used for identifying the target area for the chip to be placed may rise from a heated element and distort an image of the target area. A calming down of the motion of the air may be necessary before the distorted image is sharp and clear enough for the chip 106 to be placed. Arranging the plurality of chips 106 approximately at room temperature may mean that a settling down of the motion of the air need not be awaited before placing the chips 106. The processing time may thus be shortened compared to the process where the chips 106 are arranged at the elevated temperature. If so desired, the arranging of the plurality of chips 106 on the carrier 102 may nevertheless be carried out in vacuum and/or at temperatures above or below room temperature.

In various embodiments, each chip 106 may have a thickness Dc (shown in FIG. 1C) in a range from about 40 µm to about 200 µm, for example from about 50 µm to about 100 µm.

In various embodiments, the plurality of chips 106 may include any type of chips, for example any type of semiconductor chips 106. The chips 106 may be manufactured by means of different technologies and may for example include integrated electrical, electro-optical and/or electro-mechanical circuits. The chips 106 may for example include diodes and/or transistors, for example metal oxide semiconductor field effect transistors (MOSFETs), insulated gate bipolar transistors (IGBTs), junction gate field effect transistors (JFETs) or bipolar transistors. The chips 106 may for example include power semiconductor chips 106, wherein the power semiconductor chips 106 may for example include power diodes and/or power transistors, e.g. power MOSFETs, power IGBTs, power JFETs or power bipolar transistors.

In various embodiments, the chip assembly 100 may include a plurality of essentially identical chips 106. Alternatively, the chip assembly 100 may include two or more different kinds of chips 106. In various embodiments, the plurality of chips 106 in the chip assembly 100 may be arranged and electrically connected, for example by means of the electrically conductive material of the carrier 102, which may for example be a bulk material of the carrier 102 or an electrically conductive layer or structure formed on the bulk material of the carrier 102 on the top side 101 of the carrier 102, to form a circuit configuration, for example a half bridge or full bridge circuit or a three phase bridge circuit. In various embodiments, the chip arrangement 100 may be separated at some point after the fixing of the plurality of chips 106 to the carrier 102 into individual chip-carrier-units, which may form individual chip packages.

In various embodiments, as shown in FIG. 1B and in FIG. 1C, between the carrier 102 and each chip 106 of the plurality of chips 106, an interconnect material 104 may be arranged. In various embodiments, the interconnect material 104 may be arranged on the chip 106, for example on the back side of the chip 106b, before the chip 106 is placed on the carrier 102. In various embodiments, the interconnect material 104 may be arranged on the carrier 102 before the chip 106 is arranged on the carrier 102 (or rather, on the interconnect material 104 that is disposed on the carrier 102). The interconnect material 104 may be formed as a layer, for example as a continuous layer or as a structured layer. The interconnect material 104 may have an initial thickness Db1 (i.e. a thickness before the fixing of the chip 106 to the carrier 102) in a range from about 500 nm to about 20 µm, for example from about 1 µm to about 5 µm.

The interconnect material 104 may include or essentially consist of an electrically and/or thermally conductive material. It may for example include or essentially consist of a metal, for example at least one of a group consisting of: tin; silver; indium; gallium; bismuth; gold; and copper. The electrically conductive material may for example include or essentially consist of a solder, for example a diffusion solder, a solder paste, or a solder layer, a bistage material, a sinter paste, a wafer backside coating glue, a conductive die attach film, a conductive adhesive, or the like.

In various embodiments, as shown in FIG. 1B, the plurality of chips 106 may be arranged directly on the carrier 102, for example directly on the top side 101 of the carrier 102. In other words, the chips 106 may be arranged on the carrier 102 with the interconnect material 104 physically contacting the carrier 102, for example physically contacting the top side 101 of the carrier 102. In that case, the interconnect material 104 may be configured to adhere to the carrier 102, for example to the top side 101 of the carrier 102. In other words, a holding force holding the plurality of chips 106 in their respective positions on the carrier 102 may be exerted by the interconnect material 104 disposed between each of the chips 106 and the carrier 102. The holding force may be an adhesive force, for example a mechanically adhesive force. The interconnect material 104 may be a viscous material. The interconnect material 104 for the chips 106 to be arranged on an essentially flat surface of the carrier 102 may have a relatively high viscosity and a relatively high viscosity, as compared for example with the interconnect material described in the context with FIG. 3A to FIG. 3E. The interconnect material 104 may be an electrically conductive adhesive, for example an electrically conductive glue, a solder paste or a sinter paste.

In various embodiments, the holding force holding the plurality of chips 106 in their respective positions on the carrier 102 may be high enough to essentially avoid a displacement of the chips 106 during a transfer of the carrier 102 from a position, for example a processing position, where the chips 106 are placed on the carrier 102 to a position, for example another processing position, where the plurality of chips 106 are fixed to the carrier 102. In other words, a regular acceleration and/or constant velocity motion of the carrier 102 (i.e., a motion of the carrier 102 expected to occur on a regular basis) may not lead to a displacement of the chips 106 arranged on the carrier 102. Furthermore, the holding force may be high enough such that also more unexpected motions of the carrier 102, for example accelerations, for example accelerations in an arbitrary direction, for example accelerations caused by collisions and/or failures in a system transporting the carrier 102, may in a typical case essentially not lead to a displacement of the plurality of chips 106.

In various embodiments, the interconnect material 104 may remain viscous until the fixing of the plurality of chips 106 to the carrier 102. In various embodiments, the holding force exerted by the interconnect material 104 on the chip 106 and the carrier 102, respectively, after the arranging of the chip 106 on the carrier 102 may be much lower than a holding force exerted by the interconnect material 104 on the chip 106 and the carrier 102, respectively, after the fixing of the chip 106 to the carrier 102. The holding force exerted by the interconnect material 104 on the chip 106 and the carrier 102 after the fixing of the chips 106 to the carrier 102 may also be referred to as the holding fixed force. As an example to visualize a difference in the strengths of the holding force and the holding fixed force, after the arranging of the chip 106 on the carrier 102, the chip 106 could still be picked up, for example manually or by means of a picking device, and thereby be separated from the carrier 102 without damaging the chip 106 and/or the carrier 102. However, such a picking up of the chip 106 would essentially not be possible after the fixing of the chip 106 to the carrier 102 without damaging the chip 102 and/or the carrier 102.

In various embodiments, after the arranging of the plurality of chips 106 on the common carrier 102, the plurality of chips 106 may be fixed to the carrier 102 in at least one common process. In other words, at least one process may be executed that acts on the whole plurality of chips 106 in common and causes, possibly in combination with other processes acting on the chips 106 in common or individually, the fixing of the plurality of chips 106 to the common carrier 102. In other words, a fixing connection, also referred to as interconnect, may be formed between each chip of the plurality of chips 106 and the common carrier 102.

In various embodiments, for example if the fixing of the plurality of chips 106 to the carrier 102 includes soldering, the fixing of the plurality of chips 106 to the common carrier 102 may be performed in vacuum, for example in a vacuum press with a heating device 112. Heat and pressure may be applied, for example at the same time, in order to obtain a good mechanical area contact between the chip 106 and the carrier 102, for example between the chip 106 and a leadframe 102, for example by means of solder that gets molten and hardens again during cooldown. Alternatively, for example if the fixing of the plurality of chips 106 to the carrier 102 includes glueing the chips 106 to the common carrier 102 by means of an electrically conductive glue 104, the fixing may be performed at a pressure different from a typical vacuum pressure, for example at an ambient pressure or at a pressure above or below the ambient pressure.

In various embodiments, the fixing of the plurality of chips 106 to the common carrier 102 may be performed in a gaseous environment. The gas may include air. Alternatively, the gas may have a composition different from air, for example the gas may essentially consist of an inert gas, for example nitrogen.

In various embodiments, the fixing the plurality of chips 106 to the common carrier 102 may be carried out in a reactive atmosphere. The reactive atmosphere may consist of any atmosphere that is capable of removing oxides. The reactive atmosphere may for example include or essentially consist of formic acid or forming gas. In other words, before and/or during the fixing of the plurality of chips 106 to the common carrier 102, the plurality of chips 106, the common carrier 102 and/or the interconnect material 104 may be exposed to the reactive atmosphere, and the reactive atmosphere may remove oxides from surfaces of the chips 106, the carrier 102 and/or the interconnect material 104.

If the interconnect material 104 is formed as a structured layer, parts that may be in or come into physical contact with the structured interconnect material 104 may be formed as a corresponding structure. By way of example, if the interconnect material 104 is formed as a structured layer 104 on the back side 106b of the chip 106, chip contacts (not shown) on the back side 106b of the chip 106 may be arranged in such a way that they are electrically connected to at least a part of the structured interconnect material 104. The electrically conductive structures on the back side 106b of the chip 106 and of the interconnect material 104 may for example be formed to essentially match, i.e. to have essentially the same shape when arranged one upon the other. The chip 106 with the structured interconnect material 104 may subsequently be arranged on the carrier 102, wherein the carrier 102 may include an electrically conductive structure (not shown), for example the electrically conductive structured layer on the top side 101 of the carrier 102. The electrically conductive structure may be arranged in such a way that it is electrically connected to at least a part of the structured interconnect material 104. The electrically conductive structures on the carrier 102 and of the interconnect material 104 may for example be formed to essentially match, i.e. to have essentially the same shape when arranged one upon the other.

In various embodiments, the carrier 102 with its electrically conductive structure, the structured interconnect material 104 and the chip 106 with the chip contacts on the back side 106b of the chip 106 may be arranged, mutatis mutandis, in a similarly matching way if the interconnect material 104 is first arranged on the carrier 102, for example on the top side 101 of the carrier 102, on which the plurality of chips 106 is then placed.

As shown in FIG. 1C, the fixing of the plurality of chips 106 to the common carrier 102 may include a heating of the interconnect material 104 by means of thermal energy 114, also referred to as heat 114. The heat 114 may for example be introduced by means of the heating device 112, for example a hot plate 112, an inductive device 112 or any other device that is suitable for heating up the interconnect material 104 without damaging other parts of the chip assembly 100, into the carrier 102, and from there at least a fraction of the heat 114 may be transferred to the interconnect material 104. The arrow symbolizing the thermal energy 114 introduced into the system is not meant to limit the introducing of the heat 114 to an introducing from the bottom of the chip assembly 100, nor to an introducing from a single point. Instead, the thermal energy 114 may be introduced by any means, from any direction and through any number of points or areas that allow a heating of the interconnect material 104 to a desired temperature, for example to a melting temperature of the interconnect material 104, without damaging other parts of the chip assembly 100, and to stop introducing the thermal energy 114 into the interconnect material 104 if and when desired and/or required.

In various embodiments, the interconnect material 104 may need to be molten in order for a fixing of the plurality of chips 106 to the common carrier 102 to occur, for example if the interconnect material 104 is the solder paste or the sinter paste. In that case, an amount of the heat 114 may be adjusted in such a way that the interconnect material 104 may reach a temperature at or above its melting point. When the interconnect material 104 is molten, the heating of the interconnect material 104 may be stopped, for example by stopping the heating of the heating device 112, e.g. by turning off power to the heating device 112. Alternatively, the chip assembly 100 may for example be removed from the heating device 112, or the heating device 112 may be removed. The molten interconnect material 104 may harden and thereby fix the chips 106 to the carrier 102. The pressure force 108 and/or the heat 114 applied to the plurality of chips 106 and/or the carrier 102, respectively, may be maintained as long as required for a formation of an interconnect, e.g. a fixed connection, for example an electrically conductive connection, for example an inter-metallic compound, between the interconnect material 104 and the carrier 102, for example the leadframe 102. The plurality of chips 106 may be fixed with their back sides 106b onto the top side 101 of the carrier 102.

The interconnect material 104 may fix each of the chips 106 to the carrier 102 for example by means of flowing into small, for example microscopic, openings in a surface of the chip 106, for example in a surface of the back side 106b of the chip 106, and in a surface of the carrier 102, for example in the top side 101 of the carrier 102, respectively, and hardening there. Thereby, the hardened interconnect material 104 may form a joining anchor in each of the two respective parts to be fixed to each other, i.e. the chip 106 and the carrier 102.

The interconnect material 104 may fix each of the chips 106 to the carrier 102 for example by means of diffusing into the material of the chip 106, for example into a surface, for example a metallic surface, of the back side 106b of the chip 106, and into a surface of the carrier 102, for example a metallic surface of the carrier 102, for example in the top side 101 of the carrier 102, respectively. There, the interconnect material 104 may form an intermetallic compound with the respective, e.g. metallic, material of the carrier 102 and of the chip 106, and the intermetallic compound and any remaining interconnect material 104 may harden. Thereby, the hardened intermetallic compound and the hardened interconnect material 104 may form a joining anchor in each of the two respective parts to be fixed to each other, i.e. the chip 106 and the carrier 102. This process may also be referred to as diffusion soldering. For the diffusion soldering, the interconnect material 104 may be formed on the back side 106b of the chip 106 or on the carrier 102, for example with a thickness in a range from about 1 µm to about 20 µm. The diffusion soldering may be performed in a vacuum environment, for example in an evacuated press. The temperature to be reached by the interconnect material 104, for example its melting temperature, may be in a range from about 250° C. to about 400° C., for example about 350° C. This temperature of the interconnect material 104 may be upheld for a duration in a range from about 0.5 seconds to about 60 minutes, for example for about 1 second or for about 30 minutes.

A diffusion solder, for example if it includes a plurality of layers of materials, may also be referred to as a solder system. A diffusion solder or a diffusion solder system may for example include or consist of at least one material or a plurality of materials in a stack of layers of a group consisting of tin (Sn); tin and silver (SnAg); indium (In); indium and tin (InSn); indium and silver (InAg); gold and tin (AuSn); aluminum (Al), titanium (Ti), copper (Cu), tin (Sn) and silver (Ag); titanium (Ti), copper (Cu), tin (Sn) and silver (Ag); aluminum (Al), titanium (Ti), nickel (Ni), tin (Sn) and silver (Ag); titanium (Ti), nickel (Ni), tin (Sn) and silver (Ag); aluminum (Al), chromium (Cr), copper (Cu), tin (Sn) and silver (Ag); chromium (Cr), copper (Cu), tin (Sn) and silver (Ag); aluminum (Al), chromium (Cr), nickel (Ni), tin (Sn) and silver (Ag); chromium (Cr), nickel (Ni), tin (Sn) and silver (Ag); titanium (Ti) and a gold-tin-alloy (AuSn); aluminum (Al), titanium (Ti) and a gold-tin-alloy (AuSn); titanium (Ti), a nickel-vanadium-alloy (NiV) and a gold-tin-alloy (AuSn); aluminum (Al), titanium (Ti), a nickel-vanadium-alloy (NiV), and a gold-tin-alloy (AuSn); titanium (Ti), copper (Cu) and a silver-tin-alloy (AgSn); aluminum (Al), titanium (Ti), copper (Cu) and a silver-tin-alloy (AgSn); titanium (Ti), nickel (Ni) and a silver-tin-alloy (AgSn); aluminum (Al), titanium (Ti), nickel (Ni) and a silver-tin-alloy (AgSn); and indium-tin/indium.

Alternatively or additionally, the fixing of the plurality of chips 106 to the common carrier 102 may include pressing the plurality of chips 106 onto the carrier 102. In FIG. 1C, this is symbolized by an arrow 108 indicating a force 108 being exerted on the plurality of chips 106 to press the chips 106 onto the common carrier 102. In other words, the pressing force 108 may be applied and directed in such a way that the plurality of chips 106 is pressed in common onto the carrier 102. The arrow 108 may indicate the direction in which a press 110 may be moved in order to press the chips 106 onto the carrier 102. A counter-force provided by a stationary support on which the chip arrangement 100 may be supported is not shown. The single arrow 108 is not meant to limit an applying of the force 108 at a single point or in only the direction shown. Instead, the force 108 may be applied at a single point, at a plurality of points, and/or at one or more areas, as long as the plurality of chips 106 is pressed in a common process, i.e. a press 110 is configured, e.g. shaped, in such a way that the force 108 may be distributed to press the plurality of chips 106 simultaneously. The direction of the force 108 may be essentially normal to a plane along the back side 106b of the plurality of chips 106. In other words, the force 108 may be applied from above the plurality of chips 106 or from below the common carrier 102, and it may be applied in a direction essentially vertical to the back side 106b of the chips 106. In a case where the top side 101 of the carrier 102 is essentially parallel to the back side 106b of the chips 106, the force 108 may be essentially normal to the top side 101 of the carrier 102. In other words, the plurality of chips 106 and the common carrier 102 may be pressed together by means of the force 108, for example by means of a press 110, in such a way that the chips 106 and the carrier 102 move essentially only in respective directions towards each other, essentially without any relative lateral movement (i.e. essentially parallel to the top side 101 of the carrier 102) between any chip 106 of the plurality of chips 106 and the carrier 102.

By way of example if the fixing of the plurality of chips 106 to the carrier 102 may not include the heating of the interconnect material 104, the pressing of the chips 106 onto the carrier 102 with the interconnect material 104 arranged between each of the chips 106 and the common carrier 102 may cause or promote the plurality of chips 106 to be fixed on the carrier 102. By way of example, if the interconnect material 104 is an electrically conductive adhesive, for example an electrically conductive glue, for example a wafer backside coating glue, the pressing force 108 exerted on the plurality of chips 106 may cause parts of the interconnect material 104 to be pressed into small, for example microscopic, openings in the surface of the chip 106, for example in the surface of the back side 106b of the chip 106, and in the surface of the carrier 102, for example in the top side 101 of the carrier 102, respectively. The interconnect material 104 may then be allowed or caused to harden, for example by means of, e.g. awaited or promoted, evaporation of a solvent included in the interconnect material, by a chemical reaction taking place in the interconnect material 104, or the like. Thereby, the hardened interconnect material 104 may form a joining anchor in each of the two respective parts to be fixed to each other, i.e. the chip 106 and the carrier 102.

In various embodiments, for example in the case where the interconnect material 104 is heated, but also when it is not heated, the pressing of the plurality of chips 106 onto the carrier 102, and the pressure force exerted thereby on the interconnect material 104, may cause cavities formed in the interconnect material 104 or at a boundary between the interconnect material 104 and the carrier 102 or between the interconnect material 104 and the chip 106, respectively, to be filled by the interconnect material 104. Thereby, a mechanical strength of a connection between each chip 106 and the common carrier 102 may be improved, and the electrical (and also a thermal) conductivity across the interconnect material 104 may be improved.

In various embodiments, the force 108 applied to the chip assembly 100 may cause the plurality of chips 106 to be pressed onto the carrier 102 with a pressure in a range from about 0.5 bar to about 4 bar, for example around 3 bar.

The force 108 on the plurality of chips 106 may be exerted by means of a press 110 pressing on the front sides 106f of the plurality of chips 106, while the carrier 102 with the plurality of chips 106 arranged on it may be arranged on a support, for example a stationary support, exerting a counter-force to the force 108. In other words, the chip arrangement 100 may, for the process of pressing the chips 106 onto the carrier 102 by means of a downward displacement of the press 110, be arranged on a support, for example a flat surface, for example the heating plate 112, that does not give in to the force 108. The press 110 may be arranged below the chip assembly 100 and be moved upward for pressing the chip assembly 100 against a stationary support arranged above the plurality of chips 106. In that case, the force 108 could be visualized as being introduced from a bottom side of the chip assembly 100, for example from essentially the same direction as the heat 114. For example, the heating plate 112 could be configured to press the carrier 102 against the plurality of chips 106.

The press 110 may include a press plate 110, for example a press plate 110 with a flat underside 111 facing the plurality of chips 106. The flat underside 111 may be arranged essentially parallel to the top side 101 of the carrier 102. As a consequence, after the fixing of the plurality of chips 106 to the common carrier 102 by means of a process including the common pressing of the plurality of chips 106 to the common carrier 102, the front sides 106f of the plurality of chips 106 may all have essentially the same distance Dc+Db2 to the top side 101 of the common carrier 102. In other words, after the pressing of the chips 106 to the carrier 102, the front sides 106f of the plurality of chips 106 may be essentially flush with each other.

A shape of the press 110 may differ from a plate, and/or from a plate with a flat underside 111. However, the press 110 may be configured, e.g. be large enough and be shaped on its underside 111 in such a way that it may physically contact the plurality of chips 106 and press them simultaneously towards the common carrier 102.

The fixing of the plurality of chips 106 on the common carrier 102, for example by means of applying the heat 114 and/or by exerting the force 108, may cause the (initial) thickness Db1 of the interconnect material 104 to become smaller. A thickness of the interconnect material 104 after the fixing process may be referred to as the final thickness Db2 of the interconnect material 104. A thickness Dc of the chip 106 may remain essentially unchanged by the fixing process.

What was described above with respect to a geometry of the press, an alignment of the front sides 106f of the chips 106, a thickness of the interconnect material before and after the pressing, etc., may similarly apply to a case in which the force 108 may be applied from below the carrier 102 or from above the plurality of chips 106 and from below the carrier 102.

The fixing of the plurality of chips 106 on the common carrier 102, for example by means of applying the heat 114 and/or by exerting the force 108, may be executed in vacuum. Alternatively, it may be executed in an inert atmosphere, for example in a nitrogen atmosphere.

A positioning accuracy of each of the chips 106 of the plurality of chips 106 may depend on tools used for directing the device used for arranging the chips 106 on the carrier 102. For example a camera may be used that may show a general target area, possibly together with a current position of the device arranging the chip 106. The top side 101 of the carrier 102 may be (e.g. for its functionality) structured in a way that allows the tools that may determine the target position to identify the respective target position from the structure on the top side 101 of the carrier. Alternatively or additionally, alignment structures may be provided, for example alignment structures arranged on the carrier 102.

In various embodiments, for example if the interconnect material 104 is structured, the positioning accuracy of the chip 106 on the carrier 102 may be high enough to allow for the positioning of the chip 106 with a given pitch of the structure (the pitch of a structure may be understood to mean a distance between neighboring electrically conductive structures in conjunction with a width of the conductive structures) without creating a shortcut or any similar failure of the chip assembly 100 caused by a mispositioning of the chip 106 on the carrier 102.

FIG. 2A to FIG. 2C show a chip assembly 200 at various stages of its formation by means of a method of forming a chip assembly according to various embodiments.

The method of forming a chip assembly 200 according to various embodiments, of which three stages are shown, may for a large part be essentially the same as the method of forming a chip assembly described above in the context of FIG. 1A to FIG. 1C. Except for differences pointed out below, parts, processes, features, parameters etc. may essentially be the same as or analogous to those described above in the context of FIG. 1A to FIG. 1C.

The method of forming the chip assembly 200 may differ from the method of forming the chip assembly 100 in that the top side 101 of the carrier 102 may not be flat. A plurality of cavities 220, also referred to as "the cavities", may be formed in the carrier 102. If a single cavity 220 is referred to in the following, unless noted otherwise, this refers to one cavity 220 of the plurality of cavities 220. The plurality of cavities 220 may for example be formed in the carrier 102 from a top side 101 of the carrier 102. In other words, the cavities 220 may be formed in the carrier 102 in such a way that an opening of each of the cavities is located on the top side 101 of the carrier 102.

The plurality of chips 106 may be arranged in the plurality of cavities 102. By way of example, each chip 106 of the plurality of chips 106 may be arranged in one of the cavities 220 of the plurality of cavities 220.

In various embodiments, the plurality of cavities 220 may be arranged in the carrier 102 essentially side-by-side, with some space between the individual cavities 220. The arrangement of the plurality of cavities 220 may form a line, a two-dimensional regular pattern, for example a grid, a two-dimensional irregular pattern, or any other kind of arrangement.

The plurality of cavities 220 may be formed in the carrier 102 by means of etching, laser ablation, milling, or/and grinding, or/and any other technique that may be suitable for forming a plurality of cavities 220 with the desired shape in the carrier 102.

Each cavity 220 of the plurality of cavities 220 may have a depth Tk. The depth of each cavity 220 of the plurality of cavities 220 may be smaller than a thickness Ht of the carrier 102. Each cavity 220 may have a length Lk and a width Wk (not shown here, but see FIG. 4C).

In various embodiments, the length Lk of each of the cavities 220 may be larger than the length 106*l* of the chip 106 of the plurality of chips 106 to be arranged in the respective cavity 220, such that the chip 106 may fit into the cavity in the length dimension.

Each of the chips 106 may be arranged in its respective cavity 220 in such a way that it does not come into physical contact with parts of the carrier 102 forming side walls 102*s* of the cavity 220 that the chip 106 is arranged in. Inner surfaces of the side walls 102*s* of the cavities 220 may be coated with a dielectric film 440 (not shown here, but in FIG. 4A). Surfaces of the sides 106*s* of the chips 106 may be coated with a dielectric film 442 (not shown here, but in FIG. 4A). In those cases where the dielectric film 440 and/or 442 is formed, the chip sides 106*s* may not come into an electrically conductive contact with the side walls 102*s* of the cavities 220, even though they may be in physical contact with them.

The width Wk of each of the cavities 220 may be larger than the width 106w of the chip 106 of the plurality of chips 106 to be arranged in the respective cavity 220, such that the chip 106 may fit into the cavity in the width dimension.

A clearance between the side of the chip 106 and the side wall 102*s* of the cavity 220 may be referred to as the clearance 222.

A positioning accuracy of each of the chips 106 on the carrier 102 may be improved by forming the plurality of cavities 220 with a small clearance 222 between each of the side walls 102*s* of each of the cavities 220 and the respective opposing sides 106*s* of each of the plurality of chips 106 arranged in the respective cavity. In other words, the positioning accuracy of each of the chips 106 on the carrier 102 may depend on the clearance 222. In other words, a position of the chip 106 on the carrier 102 may be less well defined for a chip 106 that is arranged in a cavity 220 with a large clearance 222 on each of its sides or on a carrier 102 without a cavity 220 than it may be defined for a chip 106 that is arranged in a cavity 220 with a small clearance 222. By making the clearance 222 as small as possible, for example by adjusting the clearance 222 to be in a range from about 0.5 µm to about 2 µm, the positioning accuracy of each of the chips 106 on the carrier 102 may be improved. As a consequence, chips 106 with a finer pitch may be arranged on the carrier 102.

Additionally, as described above, the structure of the top side 101 of the carrier 102 and/or one or more alignment marks may be used for determining the target position for each chip 106 to be placed in one of the plurality of cavities 220. Such alignment marks etc. may be used just for a rough determination of a target area, and for a fine positioning of the chip 106 the positioning of the chip 106 in the cavity 220 with a clearance 222 on each side of the chip 106 may be used.

The depth Tk of each of the cavities 220 may be smaller than a sum of the thickness Dc of the respective chip 106 to be arranged in the cavity and of the initial thickness Db1 of the interconnect material 104 to be arranged between the chip 106 and the carrier 102 in the cavity 220. In other words, after the arranging of each of the plurality of chips 106 in one of the cavities 220, the front sides 106*f* of the chips 106 may protrude from the respective cavity 220 they are arranged in beyond a plane in which the top side 101 of the carrier 102 outside the plurality of cavities 220 may be located.

After the arranging of the plurality of chips 106 in the respective cavities 220, the plurality of chips 106 may be fixed to the carrier 102 essentially in the same way as described above in the context of FIG. 1A to FIG. 1C.

A pressing of the chips 106 onto the carrier 102 may be executed until the initial thickness Db1 of the interconnect material 104 has diminished to the thickness Db2 after the fixing, wherein the thickness Db2 of the interconnect material 104 after the fixing of the plurality of chips 106 to the common carrier 102 may be just large enough such that a sum of the thickness Db2 of the interconnect material 104 after the fixing and the thickness Dc of the chip 106 may be essentially equal to the depth Tk of the cavity 220. In other words, the pressing of the chips 106 onto the carrier 102 may be continued until the front sides of the chips 106, which may protrude out of the cavities 220 before they are pressed on, are flush with the top side 101 of the carrier 102 outside the cavities 220.

In various embodiments, as shown in FIG. 2D and FIG. 2E, each of which may be considered as an alternative stage to the stage of formation of the chip assembly 200 shown in FIG. 2C, in the chip assemblies 201 and 202, the front sides of the chips 106 may not be flush with the top side 101 of the carrier 102 outside the cavities 220.

As shown in FIG. 2D, in a chip assembly 201, the front sides 106f of the chips 106 may protrude from the respective cavities 220 that the chips 106 are arranged in. The sum of the thickness Db2 of the interconnect material 104 after the fixing and the thickness Dc of the chip 106 may be larger than the depth of the cavity Tk. The front sides 106f of the chips 106 may be flush with each other, as shown in FIG. 2D. Alternatively, the front sides 106f of at least two chips 106 of the plurality of chips 106 may not be flush with each other (not shown).

As shown in FIG. 2E, in a chip assembly 202, the front sides 106f of the chips 106 may reside, e.g. completely, within the respective cavities 220 the chips 106 are arranged in. The sum of the thickness Db2 of the interconnect material 104 after the fixing and the thickness Dc of the chip 106 may be smaller than the depth of the cavity Tk. The front sides 106f of the chips 106 may be flush with each other, as shown in FIG. 2E. Alternatively, the front sides 106f of at least two chips 106 of the plurality of chips 106 may not be flush with each other (not shown). In various embodiments, the press 110 that may be used for fixing the chips 106 to the carrier 102 may, on a side that may be in contact with the chips 106, be shaped to press on the chips 106, e.g. on the front sides 106f of the chips 106, even when the front sides 106f of the chips 106 are within the respective cavities 220, i.e. below a plane of the top side 101 of the carrier 102. The press 110 may for example have protrusions in regions where pressure is to be exerted on the chips 106.

The interconnect material 104 may initially be formed in such a thin layer, and/or the amount of interconnect material 104 may be adjusted in such a way, that a very thin layer of the interconnect material 104 may form after the fixing of the chips 106 to the carrier 102, e.g. after the heating and/or the pressing. The shrinking of the interconnect material 104 from its initial thickness Db1 to its final thickness Db2 by means of the pressing of the plurality of chips 106 to the common carrier 102 may cause some of the interconnect material 104 to be squeezed out from in between the carrier 102 and the chip 106. In that case, the (electrically conductive) interconnect material 104 may come into physical contact with one or more of the side walls 102s of the cavity 220, for example with the inner surfaces of the side walls 102s of the cavity 220. An electrically conductive contact between the interconnect material 104 and the cavity side wall 102s may be avoided by means of the dielectric coating 440 (not shown here, but in FIG. 4A) on the side walls 102s.

FIG. 3A to FIG. 3E show a chip assembly 300 at various stages of its formation by means of a method of forming a chip assembly according to various embodiments.

The method of forming a chip assembly 300 according to various embodiments, of which five stages are shown, may for a large part be essentially the same as the method of forming a chip assembly described above in the context of FIG. 1A to FIG. 1C and FIG. 2A to FIG. 2C. Except for differences pointed out below, parts, processes, features, parameters etc. may essentially be the same as or analogous to those described above in the context of FIG. 1A to FIG. 1C and FIG. 2A to FIG. 2C.

For the sake of simplicity, only one chip 106 is shown in FIG. 3A to FIG. 3E being assembled for forming the chip assembly 300. Nevertheless, the chip assembly 300, like the chip assemblies 100 and 200, may include two or more chips 106 in any arrangement, as described above. FIG. 3A to FIG. 3E may for example be envisioned as showing a cross section through the chip assembly 300 including a line of chips 106, with the cross section vertical to the line of chips 106.

After the forming of the plurality of cavities 220, for example as described above in the context of FIG. 2A to FIG. 2C, a die attach liquid 330 may be arranged in each of the cavities 220. The die attach liquid 330 may for example be arranged in the cavities 220 by means of a die attach liquid dispenser (not shown). In other words, the die attach liquid 330 may be dispensed in the cavity 220 formed in the carrier 102, e.g. a lead frame cavity 200 or a substrate cavity 220.

An amount of the die attach liquid 330 to be arranged in each of the cavities 220 may be chosen such that it is possible to arrange the die attach liquid 330 in the respective cavity 220 without the die attach liquid 330 touching the side walls 102s of the cavity 220.

A position of the die attach liquid 330 on a bottom 220b, for example on a bottom surface, of each of the cavities 220 may be chosen such that the die attach liquid 330 in the respective cavity 220 may not touch the side walls 102s of the cavity 220. By way of example, the die attach liquid 330 may be placed essentially centrally on the bottom 220b of the cavity 220.

The amount of the die attach liquid 330 and its position on the bottom 220b of the cavity 220 may be chosen such that the die attach liquid 330 in the respective cavity 220 may not touch the side walls 102s of the cavity 220.

A surface tension of the die attach liquid 330 may be high enough for the die attach liquid 330, before having the chip 106 placed thereon, to form a fraction of a sphere (as opposed to e.g. spreading out essentially flat on the bottom 220b of the cavity 220).

An adhesion of the die attach liquid 330 to the bottom surface of the cavity 220 may be low enough for the die attach liquid 330, before having the chip 106 placed thereon, to form a fraction of a sphere (as opposed to e.g. spreading out essentially flat on the bottom 220b of the cavity 220).

The die attach liquid 330 may be chosen such that its surface tension is high enough and its adhesion to the bottom surface of the cavity 220 is low enough such that the die attach liquid 330 forms a fraction of a sphere. The die attach liquid 330 with a shape of the fraction of a sphere may be positioned essentially centrally on the bottom 220b of the cavity 220.

The die attach liquid 330 may have a boiling point that is at a temperature below, for example significantly below, a melting point of the interconnect material 104. The boiling point of the die attach liquid 330 may for example be lower than a melting point of the interconnect material 104 when both temperatures are measured at a pressure at which the plurality of chips 106 is fixed to the carrier 102. The boiling point of the die attach liquid 330 may be in a range from about 50° C. to about 200° C., for example between 95° C. and 180° C. The boiling point of the die attach liquid 330 may for example be around 174° C. at 1 atm pressure. A temperature difference between the boiling point of the die attach liquid 330 and the melting point of the interconnect material 104 when both temperatures are measured at the same pressure, for example at the pressure at which the plurality of chips 106 is fixed to the carrier 102, may be in a range from about 20° C. to about 150° C., for example from about 50° C. to about 80° C. The die attach liquid 330 may evaporate free of residues. In other words, the die attach liquid 330 may only be present during a part of the processes executed during the forming of the chip assembly 300, and during another part of the processes executed during the forming of the chip assembly 300, the die attach liquid 330 may be vanished, for example after a heating of the die attach liquid 330 to a temperature of or above its boiling point or to or above a point at which the die attach liquid 330 burns without leaving residues. In other words, the die attach liquid 330 may include or consist of any material that incinerates or evaporates essentially without leaving residues at a temperature that is lower than the fusing temperature of the interconnect material 104. The die attach liquid 330 may for example include a long-chained wax. The die attach liquid 330 may for example be or include a perfluorocarbon, for example a fully-fluorinated liquid, for example a Flourinert™ electronic liquid, for example FC-43. The die attach liquid may for example be or include purified water, i.e. water that may evaporate without leaving a residue. The die attach liquid 330 may be or include a liquid flux 330 that may promote the fixing of the chip 106 to the carrier 102 by means of the interconnect material 104, e.g. it may promote the interconnect formation between the chip 106 and a substrate 102. The liquid flux 330 may for example promote the fixing of the chip 106 to the carrier 102 by removing surface oxides from surfaces of the carrier 102 and/or the chip 106. Alternatively or additionally, the liquid flux 330 may improve a wettability of the surfaces of the carrier 102 and/or of the chip 106 by the interconnect material 104 (when the interconnect material 104 is molten).

Figure 3A:
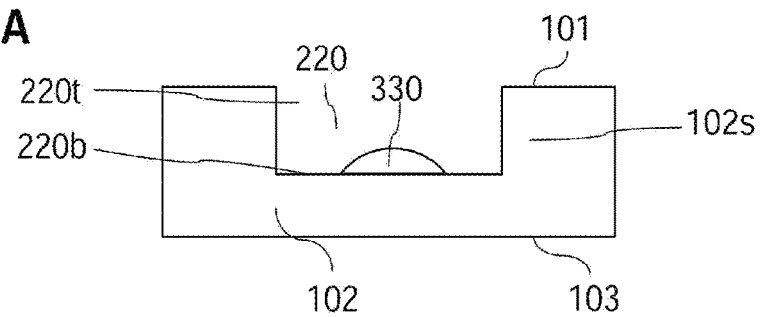
FIG. 3A to FIG. 3E show a chip assembly at various stages of its formation by means of a method of forming a chip assembly according to various embodiments.
Figure 3B:
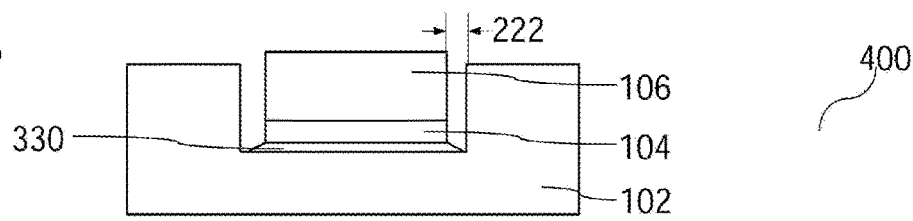

As shown in FIG. 3B, the plurality of chips 106 may be individually placed on the common carrier 102. A difference to the method described in the context with FIG. 2A to FIG. 2C may be that the plurality of chips 106 may be placed on the die attach liquid 330. In other words, each of the chips 106, for example the semiconductor chips 106, may be placed on the die attach liquid 330 in one of the cavities 220.

The die attach liquid 330 may be pressed by the chip 106, for example by the weight of the chip 106, to form a layer of die attach liquid 330 between the carrier 102, e.g. the bottom 220b of the cavity 220, and the chip 106. The interconnect material 104 may be formed on the back side 106b of the chip 106. In that case, the die attach liquid 330 may be in direct physical contact with at least the carrier 102 and the interconnect material 104 formed on the chip 106. Alternatively, if the interconnect material 104 was formed on the bottom 220b of the cavity 220, the die attach liquid 330 may be in direct physical contact with at least the chip 106 and the interconnect material 104 formed on the carrier 102.

In various embodiments, the chip 106 (with or without the interconnect material 104 formed on its back side 106b) may float on the die attach liquid 330. In other words, while the die attach liquid 330 is present, the chip 106 (or the interconnect material 104 formed on the back side 106b of the chip 106) may not be in direct physical contact with the bottom 220b of the cavity 220.

An adhesion of the chip 106 (and/or the interconnect material 104 formed on the back 106b of the chip 106) to the die attach liquid 330 may provide a holding force holding the chip 106 on the carrier 102. The holding force provided by the die attach liquid 330 may be sufficiently high to essentially prevent a displacement, for example a permanent displacement, of the chip 106 during a transport of the common carrier 102 from a location where the (individual) arranging of the plurality of chips 106 on the common carrier 102 is performed to a location where the fixing of the plurality of chips 106 to the carrier 102 is performed. The holding force exerted by the die attach liquid on the chip 106 may be sufficient to withstand acceleration and/or deceleration forces anticipated to occur during regular transport, and also acceleration and/or deceleration forces occurring during at least some unexpected collisions etc. The holding force exerted by the die attach liquid 330 may for example prevent a displacement of the chip 106 out of the cavity 220. In the various embodiments where the holding force is exerted by the die attach liquid 330, the interconnect material 104 may be an interconnect material 104 that does not provide a holding force when it is in physical contact with the carrier 102 (or with the chip 106, respectively, if the interconnect material 104 is formed on the carrier 102). In other words, if the die attach liquid 330 provides the holding force holding the plurality of chips 106 in their respective positions on the carrier 102, the interconnect material 104 need not be an adhesive, for example a glue (it may be, however).

The surface tension of the die attach liquid 330 may provide a force that leads to a self-centering of the chip 106 on the die attach liquid 330. In other words, the die attach liquid 330 may minimize its surface, and any displacement of the chip 106 that would e.g. shift the chip 106 horizontally closer to one of the side walls 102s than to the opposite side wall 102s, tilt the chip 106 with respect to the bottom 220b of the cavity 220 (i.e. tilt it out of its essentially horizontal position), and/or rotate the chip 106 within a plane of its back side 106b, may lead to an increase of the surface of the die attach liquid 330. After such a displacement, a restoring force may bring the displaced chip 106 back to its initial position, which may be essentially centered in the cavity 220. The self-centering force may be further promoted by a suitable shape of the bottom 220b of the cavity 220 (see FIG. 4B and corresponding description).

Figure 3C:
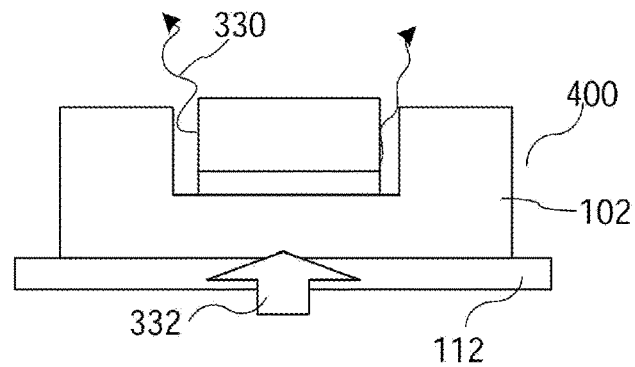

As visualized in FIG. 3C by snaking arrows 330 pointing out of the cavity 220, the die attach liquid 330 may be evaporated from the plurality of cavities 220. In other words, the die attach liquid may be an only intermediately present liquid 330 that may serve as a holding liquid for the chips 106 during pre-fixing transport. The die attach liquid 330 may be evaporated by means of increasing its temperature to at least its boiling point. The temperature of the die attach liquid 330 may be increase by means of a heating device 112, which may be identical to the heating device 112 shown and described above as the device that may be used for fixing the plurality of chips 106 to the carrier 102. Alternatively, the heating device 112 may be a separate device from the heating device 112 used for the fixing of the chips 106 to the carrier 102. The heating device 112 may provide heat 332 to the die attach liquid 330, for example by means of providing heat to the carrier 102. The amount of heat 332 may be adjusted such that the temperature used for evaporating the die attach liquid 330 may be at or above the boiling temperature of the die attach liquid 330, but below the melting temperature of the interconnect material 104. If the die attach liquid is dispensed and/or evaporated in vacuum, its boiling point may be lower than at a higher pressure. If, for example, the evaporation of the die attach liquid 330 is executed in an evacuated, heated press that may be used for fixing the plurality of chips 106 to the common carrier 102, the lower boiling point (compared to e.g. ambient pressure) of the die attach liquid 330 may mean that a lower temperature of the die attach liquid 330 is required for completely evaporating, in other words for driving out, the die attach liquid 330.

The evaporation of the die attach liquid 330 may cause each chip 106 of the plurality of chips 106 to sink to the bottom 220b of the respective cavity 220 of the plurality of cavities it is arranged in. The chip 106 may sink essentially vertically to the bottom 220b of the cavity 220. In other words, the chip 106 may essentially keep its self-centered position in the cavity 220 until essentially all of the die attach liquid 330 is evaporated. By this means, the chip 106 may be lowered to the bottom 220b of the cavity 220 while keeping it essentially centered (with respect to its horizontal position) in the cavity 220.

Figure 3D:
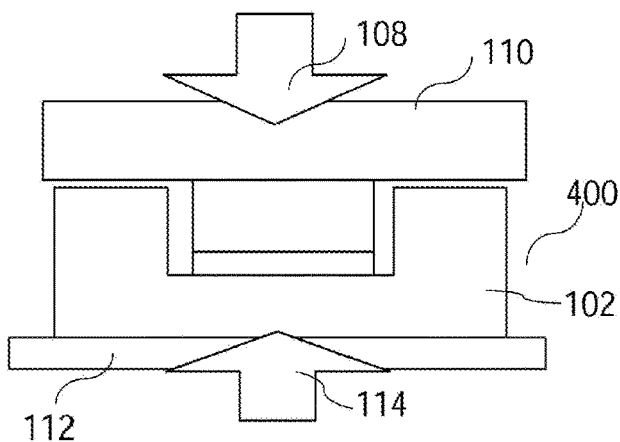

After the evaporation of the die attach liquid 330, as shown in FIG. 3D, the plurality of chips 106 may be fixed to the common carrier 102. The fixing of the plurality of chips 106 to the common carrier 102 may be performed as described above in the context with FIG. 2B.

Figure 3E:
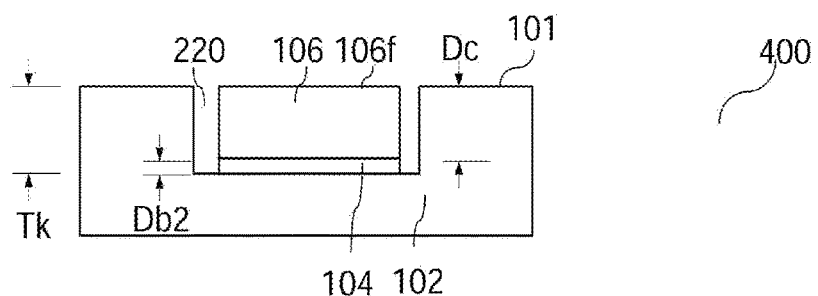

As shown in FIG. 3E, a chip assembly 300 may have been formed in which the front sides 106f of the plurality of chips 106 may be flush with the top side 101 of the common carrier 102 outside the plurality of cavities 220. The description given above in the context with FIG. 2C may also apply here.

A flat surface of the chip assembly 300 that may be achieved by the fixing of the plurality of chips 106 on the common substrate 102 in such a way that their front sides 106f are flush with the top side 101 of the common carrier 102 outside the plurality of cavities 220 may be advantageous for a further processing of the chip assembly 300. For example, it may not be necessary to build up walls or a housing, for example for mechanical protection of each of the chips 106, around each of the chips 106. Instead, forming a flat layer on top of the chip assembly 300 may be sufficient for housing the plurality of chips 106.

Figure 4A:
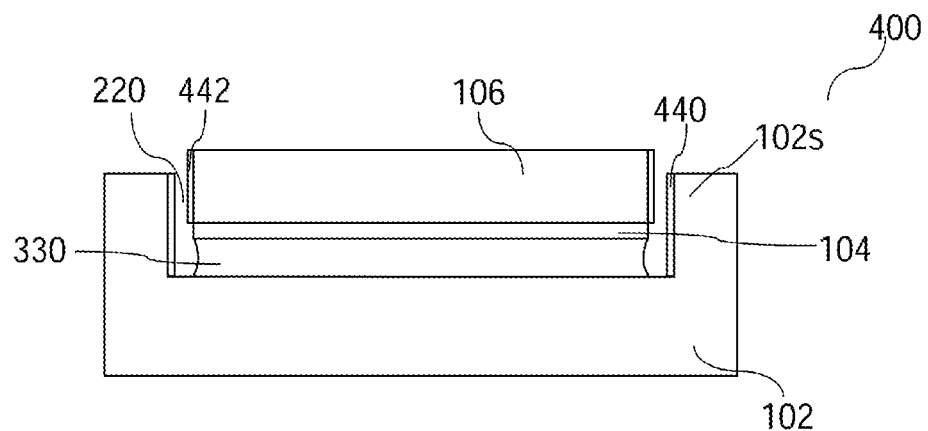
FIG. 4A to FIG. 4C each show a chip assembly during a (self-)centering stage of its formation by means of a method of forming a chip assembly according to various embodiments.
Figure 4B:
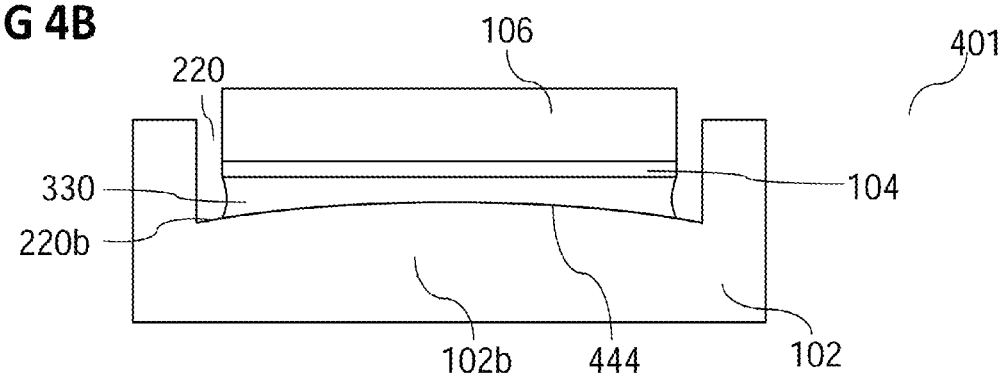
Figure 4C:
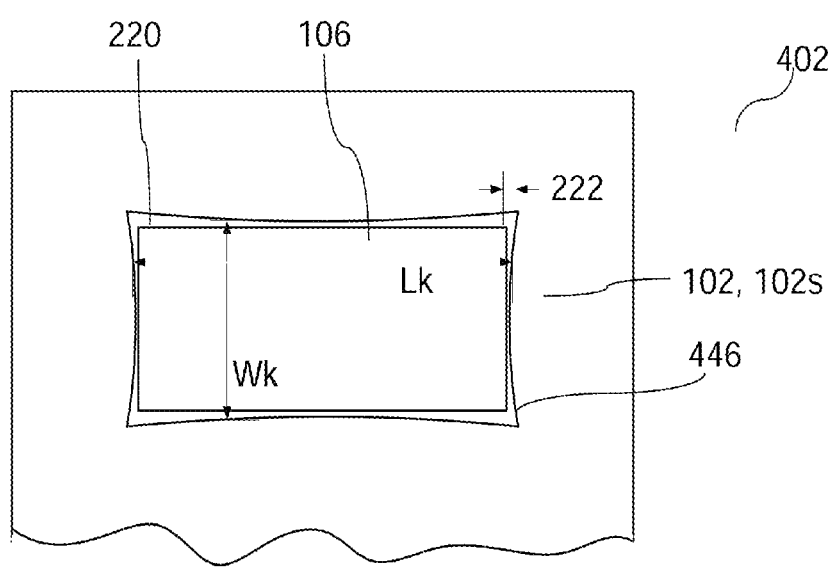

FIG. 4A to FIG. 4C each show a chip assembly 400, 401 and 402, respectively, during a (self-)centering stage of its formation by means of a method of forming a chip assembly according to various embodiments.

For the sake of simplicity, only one chip 106 is shown in each of FIG. 4A to FIG. 4C being assembled for forming the chip assemblies 400, 401 and 402, respectively. Nevertheless, the chip assemblies 400, 401 and 402, like the chip assemblies 100 and 200, may each include two or more chips 106 in any arrangement, as described above. FIG. 4A to FIG. 4C may for example be envisioned as each showing a cross section through the chip assemblies 400, 401 and 402, respectively, each including a line of chips 106, with the cross section vertical to the line of chips 106.

The method of forming the chip assembly 400, 401 and 402 may essentially correspond to the method described in connection with FIG. 3A to FIG. 3E (including the arranging of the die attach liquid 330). For FIG. 4A and FIG. 4C, also the method as described in connection with FIG. 2A to FIG. 2C may be used (leaving out the process of arranging the die attach liquid 330). Parts, materials, parameters etc. may correspond to those described in the context of FIG. 1A to FIG. 3E.

A dielectric film 440 may be formed on the side walls 102s of the plurality of cavities 220 of the chip assembly 400. The dielectric film 440 may include or consist of a dielectric material. The dielectric material may be any suitable dielectric material that may prevent an electrically conductive connection between the cavity side walls 102s and parts of the chip assembly 400 that may come into physical contact with the cavity side walls 102s from a side of the cavity 220. For example, the chip 106 and/or the interconnect material 104 may come into contact with one or more of the side walls 102s of any of the plurality of cavities 220. The dielectric film 440 may for example be or include a polymer film 440, for example a polyimide film 440. Alternatively, the dielectric film 440 may for example be an oxide film 440, for example a silicon dioxide film 440.

The dielectric film 440 may have liquid repellent properties. In other words, the dielectric film 440 may be formed with such a material and/or in such a way that it may reduce an adhesion of liquids (for example the die attach liquid 330 or the molten interconnect material 104) to the side walls 102s of the cavity 220. A rising of the die attach liquid 330 and/or of the molten interconnect material 104 on the side walls 102s of the cavity 220 by means of capillary forces may thus be alleviated or prevented. A polymer material of the dielectric film 440, for example a polyimide, may be suitable as the liquid repellent.

The dielectric film 440 may be removed after the fixing of the plurality of chips 106 to the common carrier 102. Alternatively, the dielectric film 440 may be left in place after the fixing of the plurality of chips 106 to the common carrier 102 and during further processing of the chip assembly 400. This may for example be the case if it is intended to fill a gap formed by the clearance between the chip 106 and the side walls 102s of the cavity 220 anyhow, for example with a dielectric material, for example with a polymer, for example with polyimide.

In various embodiments, the dielectric film 440 may have a thickness in a range from about 10 nm to about 10 μm.

A dielectric film 442 may be formed on the sides 106s of the chip 106 of the chip assembly 400. The dielectric film 442 may include or consist of a dielectric material. The dielectric material may be any suitable dielectric material that may prevent an electrically conductive connection between the cavity side walls 102s and the sides 106s of the chip 106. The dielectric film 442 may for example be or include a polymer film 442, for example a polyimide film 442. Alternatively, the dielectric film 442 may for example be an oxide film 442, for example a silicon dioxide film 442.

The dielectric film 442 may be removed after the fixing of the plurality of chips 106 to the common carrier 102. Alternatively, the dielectric film 442 may be left in place after the fixing of the plurality of chips 106 to the common carrier 102 and during further processing of the chip assembly 400.

The dielectric film 442 may have liquid repellent properties. In other words, the dielectric film 442 may be formed with such a material and/or in such a way that it may reduce an adhesion of liquids (for example the die attach liquid 330 or the molten interconnect material 104) to the side walls 106s of the chip 106. A rising of the die attach liquid 330 and/or of the molten interconnect material 104 along the side walls 106s of the chip 106 by means of capillary forces may thus be alleviated or prevented. A polymer material of the dielectric film 440, for example a polyimide, may be suitable as the liquid repellent.

In various embodiments, the dielectric film 442 may have a thickness in a range from about 10 nm to about 10 μm.

As described in the context of FIG. 3B, the arranging of the chip 106 on the die attach liquid 330 may lead to a self-centering effect centering the chip 106 in the cavity 220. The self-centering effect may be further promoted, for example as shown in FIG. 4B.

A part of the bottom 102b of the carrier 102 that is located inside the cavity 220 may have a convex shape, i.e. a curvature pointing away from the carrier 102. By way of example, the part of the bottom 102b of the carrier 102 that is located inside the cavity 220 may be formed as a part of a sphere with the center of the sphere located outside the carrier 102 below the carrier 102 and essentially centrally below the respective cavity 220 of the plurality of cavities 220. Or, as a different way to describe the geometry, the bottom 220b of the cavity 220 may have a concave shape, i.e. a curvature pointing towards the cavity 220. A highest point (in vertical direction) of the bottom 102b of the carrier 102 inside each cavity 220 may be arranged, within the horizontal plane, essentially centrally in the respective cavity 220. The described shape of the bottom 220b of the cavity 220 (and/or of the bottom 102b of the carrier 102, respectively) may cause the surface of the die attach liquid 330 to increase even more than with a flat bottom 220b of the cavity 220 when the die 106 is displaced from its central position. Thus, the restoring force moving the chip 106 back to its central position after a displacement may be increased.

As shown in FIG. 4C, a shape of the cavity 220 with respect to its side walls 102s need not be rectangular. For example the width Wk of the cavity 220, measured between two opposing sides 102s of the cavity 220, may not be constant along the length Lk, measured between the other two opposing sides of the cavity 220, and/or for example the length Lk of the cavity 220 may not be constant along the width Wk of the cavity 220. As shown in FIG. 4C, the length Lk and the width Wk of the cavity 220 may be smallest if measured across the center of the cavity 220. Consequently, the clearance 222 between the chip 106 and the side walls 102s of the cavity 220 may be smallest measured across the center of the chip 106.

Alternatively, the side walls 102s of the cavity 220 may be shaped in a different way, such that the clearance 222 is smallest for example near corners of the chip 106.

The non-rectangular shape of the cavity 220 may improve the positioning accuracy of the chip 106 in the cavity 220 and/or facilitate the positioning process of the chip 106 in the cavity 220, respectively: For a good positioning accuracy of the chip 106 in the cavity 220, the cavity 220 may not be much bigger than the chip 106. In other words, the smaller the clearance 222 on the four sides 106s of the chip 106, the better the positioning accuracy of the chip 106 in the cavity 220 (and hence on the carrier 102). However, if the clearance 222 is very small, it may be very difficult to arrange the chip 106 in the cavity 220. The non-rectangular shape of the cavity 220 may make it possible to keep the clearance 222 very small for at least some part of a circumference of the cavity 220, for example for at least a part of each of the sides 102s of the cavity 220. Consequently, a high positioning accuracy may be achieved for the arranging of the plurality of chips 106 on the common carrier 102.

On the other hand, the non-rectangular shape of the cavity 220 may make it possible to form a relatively large clearance 222 for at least some part of a circumference of the cavity 220, for example for at least a part of each of the sides 102s of the cavity 220. Consequently, it may be easier to arrange the chip 106 in the cavity 220, for example to hit the cavity 220 with the chip 106 in a process, for example in an automatic process, of arranging the chip 106 in the cavity 220. Thus, the arranging of the plurality of chips 106 on the common carrier 102 may be facilitated.

Figure 5A:
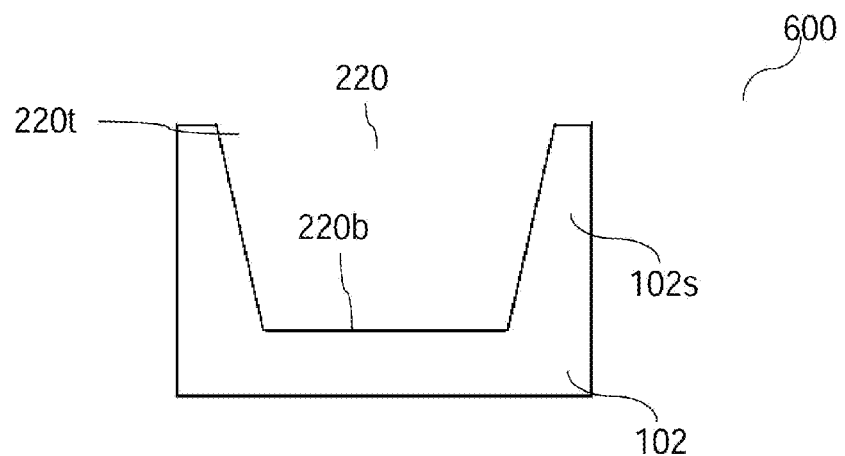
FIG. 5A and FIG. 5B each show a carrier with a cavity for use in a method of forming a chip assembly according to various embodiments.
Figure 5B:
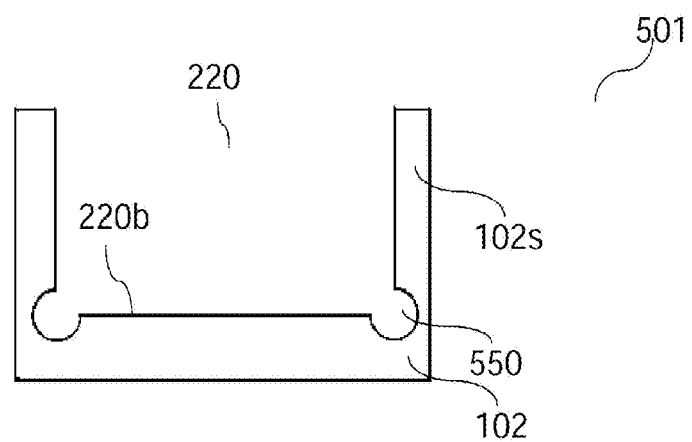

FIG. 5A and FIG. 5B each show a carrier 102 for a chip assembly 500 and 501, respectively, with a cavity 220 for use in a method of forming the chip assembly 500, 501 according to various embodiments.

For the sake of simplicity, only one cavity 220 is shown in each of FIG. 5A and FIG. 5B. Nevertheless, the chip assemblies 500 and 501, respectively, being formed, may each include two or more chips 106 in any arrangement, as described above. FIG. 5A and FIG. 5B may for example be envisioned as each showing a cross section through the carrier 102 for the chip assembly, wherein the chip assembly may include a line of chips 106, with the cross section vertical to the line of chips 106.

The method of forming the chip assemblies 500, 501 may essentially correspond to the method of forming the chip assemblies 200, 300, 400, 401 or 402, as described in connection with FIG. 2A to FIG. 4C (including the forming of the plurality of cavities 220). Parts, materials, parameters etc. may correspond to those described in the context of FIG. 1A to FIG. 4C.

As shown in FIG. 5A and 5B, the plurality of cavities 220 may be formed in such a way that a wetting of the side walls 102s of the plurality of cavities 220 may be prevented or at least alleviated. In other words, a risk of side wall wetting of the chip sides 106s and/or of the cavity sides 102s may be reduced by an appropriate design (e.g. a geometry) of the cavities 220.

As shown in FIG. 5A, the plurality of cavities 220 may be formed with side walls 102s of the cavities 220 inclined away from the cavity 220 in a direction from the bottom 220b of the cavity 220 to a top 220t of the cavity 220. In other words, the length Lk and the width Wk of the cavity 220 may increase from the bottom 220b of the cavity 220 to the top 220t of the cavity 220 due to the cavity side walls 102s inclining away from the cavity 220.

Given such a geometry of the cavity side walls 102s, a liquid entering a bottom of the clearance 222 (see e.g. FIG. 2C or FIG. 3B) between the chip sides 106s and the cavity side walls 102s may not be pulled into the clearance 222, e.g. upwards into the clearance 222, by means of capillary forces, because a rising of the liquid in the clearance 222 would lead to an increase of the surface of the liquid. At least, the liquid may rise less high into the clearance 222 than it would if the cavity side walls 102s were formed as vertical side walls.

This may mean that the geometry of the cavity side walls 102s inclined away from the cavity 220 may prevent or alleviate a wetting of the cavity side walls 102s by the liquids used in the method of forming of the chip assembly, for example the die attach liquid 330 or the interconnect material 104 if it is molten. Having the die attach liquid 330 be pulled into the clearance 222 may be undesired, because this may interfere with the self-centering effect. The cavity side walls 102s inclined away from the cavity 220 may thus help to improve the positioning accuracy in the method of forming the chip assembly. Having the interconnect material 104 be pulled into the clearance 222 may be undesired, because this may remove the interconnect material 104 from a region where it is required for fixing the chip 106 to the carrier 102, i.e. from the area between the chip 106 and the carrier 102. As a consequence of some of the interconnect material being arranged between the sides 106s of the chips 106 and the cavity side walls 102s, the interconnect between the chip 106 and the carrier 102 may be flawed, i.e. a quality of the interconnect may be degraded. For example, the interconnect between the chip 106 and the carrier 102 may be mechanically less stable or its electrical conductivity may be lowered as compared to the interconnect formed with the desired amount of interconnect material 104. The cavity side walls 102s inclined away from the cavity 220 may thus help to improve the quality of the interconnect between the chip 106 and the carrier 102 in the method of forming the chip assembly.

In a case where a large excess of interconnect material 104 may be present between the chip 106 and the bottom 220b of the cavity 220, the excess interconnect material 104 may be pressed into the clearance 222, and possibly even out of a top of the clearance 222. This may make it difficult or even impossible to press on the front sides 106f of the chips 106 until they are flush with the top side 101 of the carrier 102 outside the cavities 220. Thus, a vertical positioning of the chips 106 in the cavities 220 may be degraded.

Having the side walls 102s of the cavities 220 inclined away from the respective cavity 220 may increase a volume of the clearance 222 as compared to the volume of the clearance if the side walls 102s were formed with the distance that the chip 106 and the side wall 102 may have at the bottom 220b of the cavity 220. The increased volume of the clearance 222 may provide an additional buffering volume into which the excessive interconnect material 104 may be squeezed (by the pressing force that may overcome the force exerted by the surface tension of the interconnect material 104). It may thus be prevented that the excessive interconnect material 104 is pressed out of the top of the clearance 222. This may prevent the degradation of the vertical positioning of the chip 106 in the cavity 220.

As shown in FIG. 5B, the plurality of cavities 220 may be formed with a channel 550 at the bottom 220b of each of the cavities 220. The channel 550 may be formed in corners of the cavity 220 where the side walls 102s of the cavities 220 may connect with the bottom 220b of the cavity 220. The channel 550 may for example be formed along all sides 102s of each of the cavities 220. The channel may be formed by any known means for forming such a structure, for example it may be formed by means of etching. A size, for example a diameter, of the channel may be smaller than a thickness of the carrier 102 between the bottom 220b of the cavity 220 and the bottom 103 of the carrier 102, i.e. smaller than Ht-Tk (see FIG. 2C).

Excess amounts of liquid, for example excess amounts of the die attach liquid 330 and/or of the interconnect material 104 when it is molten, may be received in the channel 550, removing them from the clearance 222. Similar to the inclined side walls 102s, the channel 550 may thus improve the positioning accuracy of the chip 106 in the cavity 220 and/or prevent the degradation of the vertical positioning of the chip 106 in the cavity 220.

Figure 6:
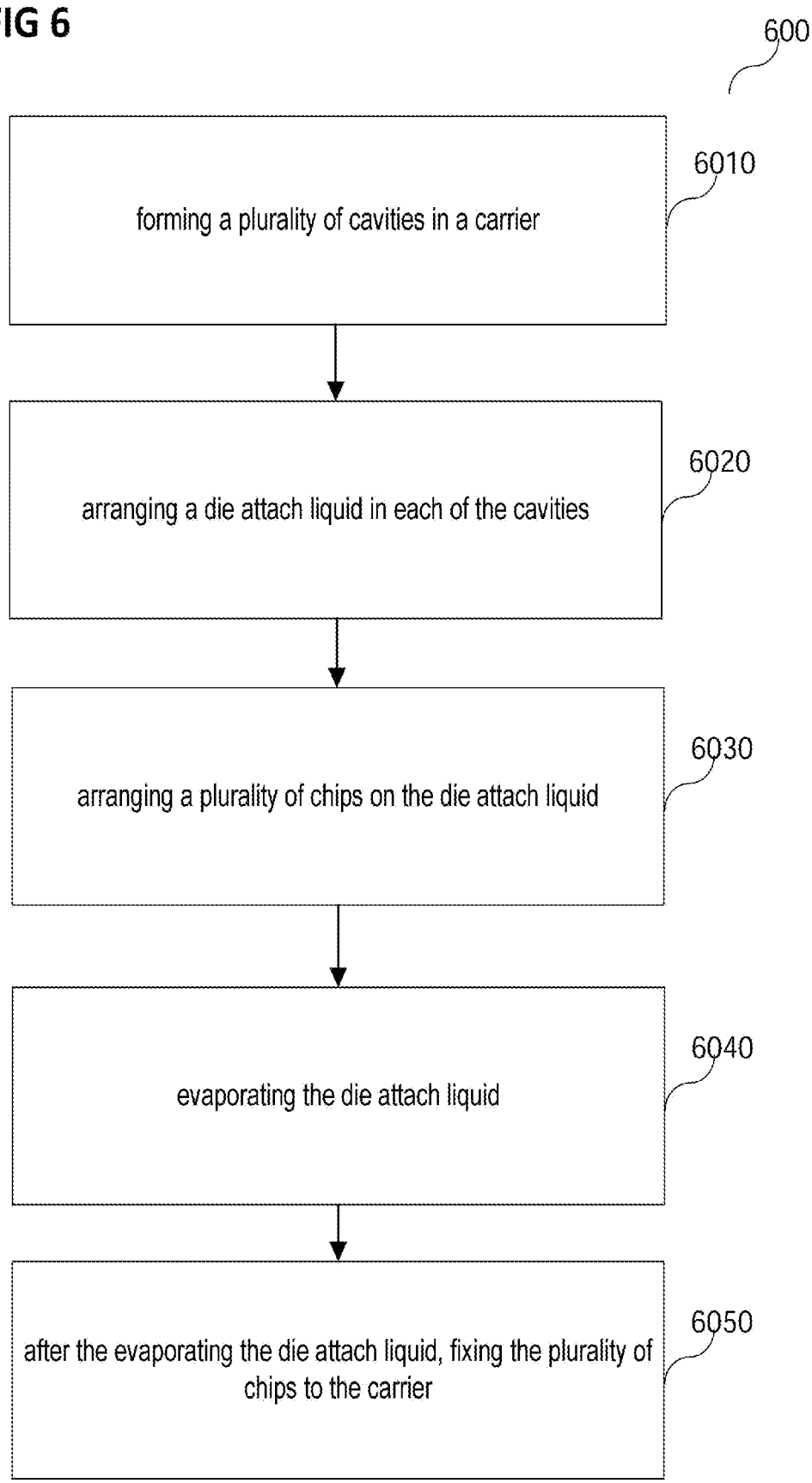
FIG. 6 shows a process flow for a method for forming a chip assembly according to various embodiments.

FIG. 6 shows a process flow 600 for a method for forming a chip assembly according to various embodiments.

In various embodiments, a method of forming a chip assembly may include forming a plurality of cavities in a carrier (in 6010).

The method may further include arranging a die attach liquid in each of the cavities (in 6020).

The method may further include arranging a plurality of chips on the die attach liquid (in 6030).

The method may further include evaporating the die attach liquid (in 6040)

The method may further include after the evaporating the die attach liquid, fixing the plurality of chips to the carrier (in 6050).

The method may include further processes that may have been described in the context of FIG. 1A to 1C, FIG. 2A to FIG. 2C, FIG. 3A to FIG. 3E, FIG. 4A to FIG. 4C, FIG. 5A and/or FIG. 5B, or that will be described in context with FIG. 7.

Figure 7:
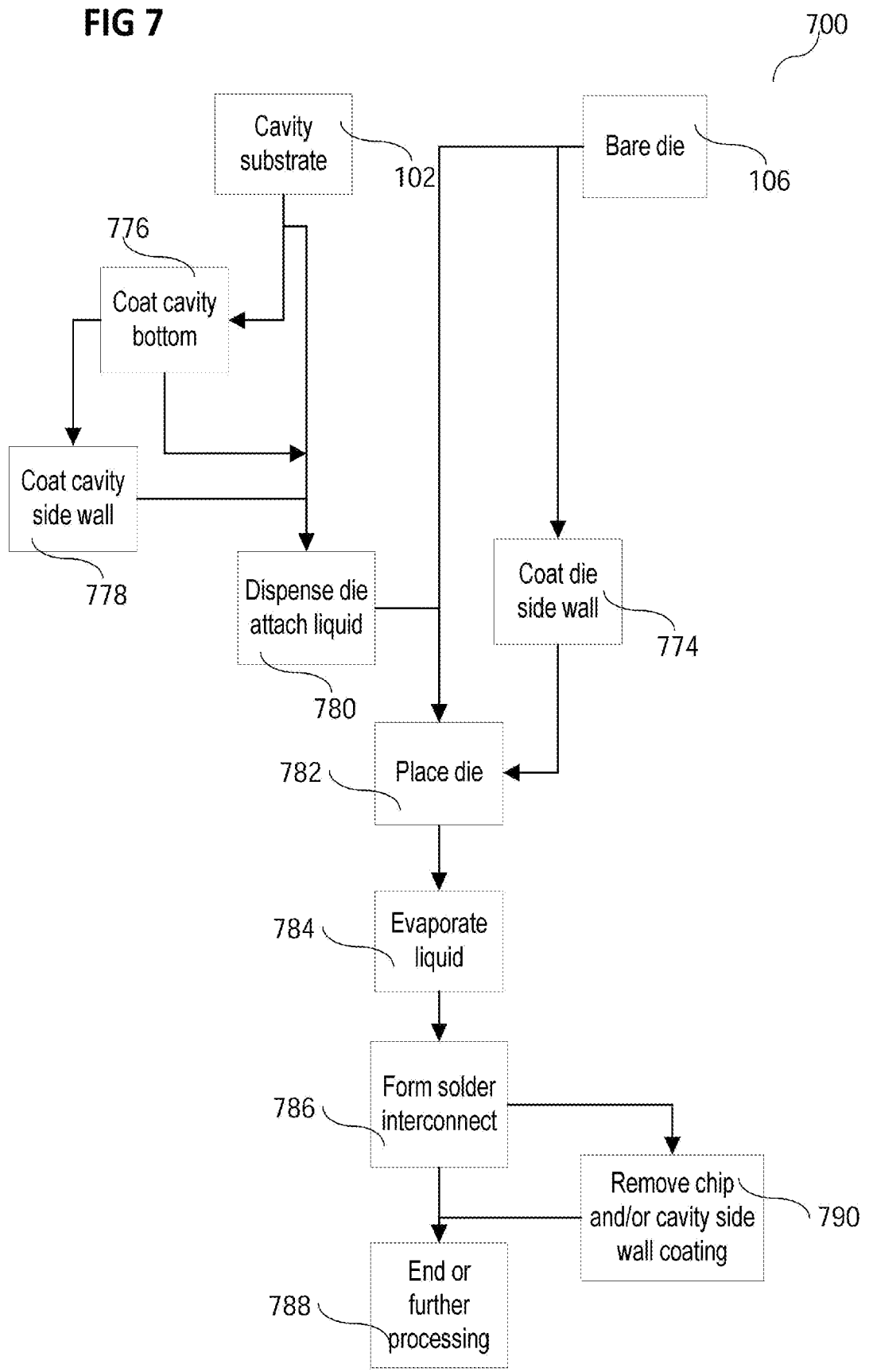
FIG. 7 shows a diagram visualizing various parts and processes used in a method for forming a chip assembly according to various embodiments.

FIG. 7 shows a diagram 700 visualizing various parts and processes used in a method for forming a chip assembly according to various embodiments.

The method visualized here may be similar to the method described in context with FIG. 3A to FIG. 3E and related figures (i.e. the method where the die attach fluid 330 may be dispensed in the cavity 220 before arranging the chip 106 on the carrier 102). Processes, materials, parameters etc. described in context with FIG. 3A to FIG. 3E and related figures may also apply here.

The chip (referred to as bare die) 106 may either be used as it is, or it may have its side walls coated (in 774). It may be placed (in 782) on the cavity substrate 102 (i.e. the substrate 102 in which a plurality of cavities may be formed, as e.g. described in context with FIG. 3A). A die attach liquid (e.g. a die attach liquid as described in context with FIG. 3A) may be dispensed on the cavity substrate 102 (in 780), e.g. the die attach liquid may be dispensed in the cavities of the cavity substrate 102, either without having a coating formed on the cavity substrate 102, or after coating the cavity bottom (in 776) and optionally the cavity side walls (in 778), e.g. with a coating as described in context with FIG. 4A.

After the placing of the chip (in 782), the die attach liquid may be evaporated (in 784), for example as described in connection with FIG. 3B.

Thereafter, a solder interconnect may be formed (in 786), for example as described in connection with FIG. 3D.

The chip and/or cavity side wall coating may be removed (in 790), or the coating may be left in place. The forming of the chip assembly may have reached its end, or the chip assembly may require further processing, for example by means of known processes (in 788).

Various embodiments may have been described with reference to a rear side interconnect material, and various embodiments may have been described with reference to a carrier interconnect material. Where ever appropriate, the description (referring e.g. to materials, methods of disposing the interconnect material, thicknesses, structuring, etc.) may also apply to the respective other interconnect material, and also to a case in which the interconnect material may be arranged on both, the back side of the chip and on the carrier.

Example 1 is a method of forming a chip assembly. The method may include forming a plurality of cavities in a carrier, arranging a die attach liquid in each of the cavities, arranging a plurality of chips on the die attach liquid, each chip comprising a rear side metallization and a rear side interconnect material disposed over the rear side metallization, wherein the rear side interconnect material faces the carrier, evaporating the die attach liquid, and after the evaporating the die attach liquid, fixing the plurality of chips to the carrier.

In Example 2, the subject matter of Example 1 can optionally include that the method further includes holding the plurality of chips, by a holding force, in respective positions in which they are arranged.

In Example 3, the subject matter of Example 3 can optionally include that the holding force is provided by the die attach liquid.

In Example 4, the subject matter of any one of Examples 1 to 3 can optionally include that the rear side interconnect material comprises at least one of a group consisting of: a solder; a solder layer; a wafer backside coating glue; a conductive die attach film; a sinter paste; a sinter layer; a bistage material; an adhesive; an adhesive foil; and an adhesive layer.

In Example 5, the subject matter of any one of Examples 1 to 4 can optionally include that the rear side interconnect material comprises at least one of a group consisting of: tin; zinc; silver; indium; gallium; bismuth; gold; lead; and copper.

In Example 6, the subject matter of any one of Examples 1 to 5 can optionally include that the rear side interconnect material comprises at least one material or stack of materials of a group consisting of: tin; tin and silver; indium; indium and tin; indium and silver; gold and tin; aluminum, titanium, copper, tin and silver; titanium, copper, tin and silver; aluminum, titanium, nickel, tin and silver; titanium, nickel, tin and silver; aluminum, chromium, copper, tin and silver; chromium, copper, tin and silver; aluminum, chromium, nickel, tin and silver; chromium, nickel, tin and silver; titanium and a gold-tin-alloy; aluminum, titanium and a gold-tin-alloy; titanium, a nickel-vanadium-alloy and a gold-tin-alloy; aluminum, titanium, a nickel-vanadium-alloy, and a gold-tin-alloy; titanium, copper and a silver-tin-alloy; aluminum, titanium, copper and a silver-tin-alloy; titanium, nickel and a silver-tin-alloy; aluminum, titanium, nickel and a silver-tin-alloy; indium-tin.

In Example 7, the subject matter of any one of Examples 1 to 6 can optionally include that the evaporating of the die attach liquid includes heating the chip assembly.

In Example 8, the subject matter of Example 7 can optionally include that the heating of the chip assembly includes heating the chip assembly to a temperature that is at least as high as an evaporation temperature of the die attach liquid and lower than a melting temperature of the rear side interconnect material.

In Example 9, the subject matter of any one of Examples 1 to 8 can optionally include that the die attach liquid evaporates essentially completely.

In Example 10, the subject matter of any one of Examples 1 to 9 can optionally include that the die attach liquid evaporates without leaving residues.

In Example 11, the subject matter of any one of Examples 1 to 8 can optionally include that the die attach liquid completely incinerates.

In Example 12, the subject matter of any one of Examples 1 to 11 can optionally include that the die attach liquid includes an organofluorine compound.

In Example 13, the subject matter of any one of Examples 1 to 12 can optionally include that the die attach liquid includes a hydrofluoroether.

In Example 14, the subject matter of any one of Examples 1 to 13 can optionally include that the die attach liquid includes an alcohol or secondary alcohol In Example 15, the subject matter of any one of Examples 1 to 14 can optionally include that the fixing the plurality of chips to the carrier includes heating the chip assembly.

In Example 16, the subject matter of Example 15 can optionally include that the heating the chip assembly includes heating to a temperature that is at least as high as the melting temperature of the rear side interconnect material.

In Example 17, the subject matter of any one of Examples 1 to 16 can optionally include that the fixing the plurality of chips to the carrier includes diffusion soldering.

In Example 18, the subject matter of any one of Examples 1 to 17 can optionally include that the fixing the plurality of chips to the carrier includes pressing the plurality of chips onto the carrier.

In Example 19, the subject matter of any one of Examples 1 to 18 can optionally include that the fixing the plurality of chips to the carrier includes pressing the plurality of chips onto the carrier until the plurality of chips is flush with a top side of the carrier outside the cavities.

In Example 20, the subject matter of any one of Examples 1 to 19 can optionally include that at least the fixing the plurality of chips to the carrier is carried out in vacuum.

In Example 21, the subject matter of any one of Examples 1 to 20 can optionally include that at least the fixing the plurality of chips to the carrier is carried out in a reactive atmosphere.

In Example 22, the subject matter of Example 21 can optionally include that the reactive atmosphere includes or essentially consists of formic acid, forming gas or any other atmosphere that is capable of removing oxides.

In Example 23, the subject matter of any one of Examples 1 to 22 can optionally include that the forming the plurality of cavities in the carrier includes forming the plurality of cavities with side walls inclined away from the cavity in a direction from a bottom of the cavity to a top of the cavity.

In Example 24, the subject matter of any one of Examples 1 to 23 can optionally include that the forming the plurality of cavities in the carrier includes forming the plurality of cavities with a channel at a bottom of each of the plurality of cavities.

In Example 25, the subject matter of any one of Examples 1 to 24 can optionally include that the forming the plurality of cavities in the carrier includes forming the plurality of cavities with a concave shape at side walls of each of the plurality of cavities.

In Example 26, the subject matter of any one of Examples 1 to 25 can optionally include that the forming the plurality of cavities in the carrier includes forming the plurality of cavities with a concave shape at a bottom of each of the plurality of cavities.

In Example 27, the subject matter of any one of Examples 1 to 26 can optionally include that the method further includes forming a rear side interconnect material repellent coating on at least one of side walls of the plurality of cavities and side walls of the plurality of chips.

In Example 28, the subject matter of any one of Examples 1 to 27 can optionally include that the method further includes forming a barrier coating for the rear side interconnect material on at least one of side walls of the plurality of cavities and/or the side walls of the plurality of chips In Example 30, the subject matter of any one of Examples 1 to 29 can optionally include that the method further includes forming a metallic coating for improved wetting or intermetallic formation on the bottom or on at least one of the side walls of the cavities.

Example 31 is a method of forming a chip assembly. The method may include forming a plurality of cavities in a carrier, disposing a carrier interconnect material over a bottom of each of the cavities, arranging a die attach liquid in each of the cavities, arranging a plurality of chips on the die attach liquid, each chip comprising a rear side metallization, evaporating the die attach liquid, and after the evaporating the die attach liquid, fixing the plurality of chips to the carrier.

In Example 31, the subject matter of Example 30 can optionally include that the carrier interconnect material includes at least one of a group consisting of: a solder; a solder layer; a back side coating solder paste; a wafer backside coating glue; a conductive die attach film; a sinter paste; a sinter layer; a bistage material; an adhesive; an adhesive foil; an adhesive layer; and a metal.

In Example 32, the subject matter of Example 31 can optionally include that the metal is one of a group consisting of: silver; nickel; full nickel and nickel phosphorus; nickel phosphorus; gold; platinum; palladium; and copper.

In Example 33, the subject matter of any one of Examples 30 to 32 can optionally include that the carrier interconnect material includes at least one material or stack of materials of a group consisting of: tin; tin and silver; indium; indium and tin; indium and silver; gold and tin; aluminum, titanium, copper, tin and silver; titanium, copper, tin and silver; aluminum, titanium, nickel, tin and silver; titanium, nickel, tin and silver; aluminum, chromium, copper, tin and silver; chromium, copper, tin and silver; aluminum, chromium, nickel, tin and silver; chromium, nickel, tin and silver; titanium and a gold-tin-alloy; aluminum, titanium and a gold-tin-alloy; titanium, a nickel-vanadium-alloy and a gold-tin-alloy; aluminum, titanium, a nickel-vanadium-alloy, and a gold-tin-alloy; titanium, copper and a silver-tin-alloy; aluminum, titanium, copper and a silver-tin-alloy; titanium, nickel and a silver-tin-alloy; aluminum, titanium, nickel and a silver-tin-alloy; indium-tin Example 34 is a chip assembly. The chip assembly may include a carrier with a top side comprising a plurality of cavities formed in the top side of the carrier, each cavity configured to receive a chip, a plurality of chips, each chip being arranged in an associated cavity of the plurality of cavities, and each chip comprising a chip contact being fixed to the bottom of the associated cavity. The top side of the carrier outside the cavities is not flush with the plurality of chips.

In Example 35, the subject matter of Example 34 can optionally include that side walls of the plurality of cavities are inclined away from the cavity in a direction from a bottom of the cavity to a top of the cavity.

In Example 36, the subject matter of any one of Examples 34 or 35 can optionally include that the plurality of cavities is formed with a channel at a bottom of each of the plurality of cavities.

In Example 37, the subject matter of any one of Examples 34 to 36 can optionally include that at least some chips of the plurality of chips protrude from the respective cavity they are arranged in.

In Example 38, the subject matter of any one of Examples 34 to 37 can optionally include that at least some chips of the plurality of chips have a thickness that is smaller than a depth of the respective cavity they are arranged in.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip assembly, comprising:
a carrier with a top side comprising a plurality of cavities formed in the top side of the carrier, each cavity configured to receive a chip, wherein at least some cavities of the plurality of cavities have a convex-shaped bottom of the cavity that is configured to self-center the chip in the associated cavity;
a plurality of chips, each chip being arranged in an associated cavity of the plurality of cavities, and each chip comprising a chip contact fixed to the bottom of the associated cavity;
wherein the top side of the carrier outside the cavities is not flush with the plurality of chips and
wherein the plurality of cavities have side walls that are convex that are configured to self-center the chip in the associated cavity.

2. The chip assembly of claim 1,
wherein side walls of the plurality of cavities are inclined away from the cavity in a direction from a bottom of the cavity to a top of the cavity.

3. The chip assembly of claim 1,
wherein the plurality of cavities are each formed with a channel where the sidewalls of the associated cavity meet a bottom of the associated cavity.

4. The chip assembly of claim 1,
wherein at least some chips of the plurality of chips have a thickness that is smaller than a depth of the respective cavity the at least some chips are arranged in.

5. The chip assembly of claim 1,
wherein at least some chips of the plurality of chips protrude from the respective cavity the at least some chips are arranged in.

6. The chip assembly of claim 1,
wherein the plurality of chips are coated with a dielectric film on the lateral surfaces of the plurality of chips.

7. The chip assembly of claim 1,
wherein the plurality of cavities have side walls coated with a dielectric film.

8. A chip assembly, comprising:
a carrier with a top side comprising a plurality of cavities formed in the top side of the carrier, each cavity configured to receive a chip, wherein the plurality of cavities are each formed with a channel where the sidewalls of the associated cavity meet a bottom of the associated cavity;
a plurality of chips, each chip being arranged in an associated cavity of the plurality of cavities, and each chip fixed to the bottom of the associated cavity;
wherein the top side of the carrier outside the cavities is not flush with the plurality of chips and
wherein the plurality of cavities have side walls that are convex that are configured to self-center the chip in the associated cavity.

9. The chip assembly of claim 8,
wherein at least some chips of the plurality of chips have a thickness that is smaller than a depth of the respective cavity the at least some chips are arranged in.

10. The chip assembly of claim 8,
wherein at least some chips of the plurality of chips protrude from the respective cavity the at least some chips are arranged in.

11. The chip assembly of claim 8,
wherein at least some cavities of the plurality of cavities have a convex-shaped bottom of the cavity that is configured to self-center the chip in the associated cavity.

12. The chip assembly of claim 8,
wherein the plurality of chips are coated with a dielectric film on the lateral surfaces of the plurality of chips.

13. The chip assembly of claim 8,
wherein the plurality of cavities have side walls coated with a dielectric film.

14. The chip assembly of claim 8,
wherein side walls of the plurality of cavities are inclined away from the cavity in a direction from a bottom of the cavity to a top of the cavity.

15. The chip assembly of claim 8,
each chip comprising a rear side metallization and a rear side interconnect material, the rear side interconnect material fixing the chip to the bottom of the associated cavity.

16. A chip assembly, comprising:
a carrier with a top side comprising a plurality of cavities formed in the top side of the carrier, each cavity configured to receive a chip;
a plurality of chips, each chip being arranged in an associated cavity of the plurality of cavities, and each chip comprising a chip contact fixed to the bottom of the associated cavity;
wherein the top side of the carrier outside the cavities is not flush with the plurality of chips and wherein the plurality of cavities have side walls that have a non-constant distance between opposite sides of an associated cavity along a length of a side.

17. The chip assembly of claim 1, wherein, for each convex-shaped bottom of the at least some cavities of the plurality of cavities having a convex-shaped bottom, the convex-shaped bottom has a highest point, the highest point being centrally located in the cavity along a horizontal axis.

18. The chip assembly of claim 17, wherein the highest point is characterized by a downward curvature in all directions.

19. The chip assembly of claim 17, wherein each convex-shaped bottom of the at least some cavities of the plurality of cavities is shaped as a spherical segment.

\* \* \* \* \*